United States Patent [19]
Hachiya

[11] Patent Number: 6,144,452
[45] Date of Patent: Nov. 7, 2000

[54] ELECTRONIC COMPONENT MOUNTING APPARATUS

[75] Inventor: Eiichi Hachiya, Katano, Japan

[73] Assignee: Matsushita Electric Industiral Co., Ltd., Osaka, Japan

[21] Appl. No.: 09/171,593

[22] PCT Filed: Apr. 22, 1997

[86] PCT No.: PCT/JP97/01385

§ 371 Date: Oct. 22, 1998

§ 102(e) Date: Oct. 22, 1998

[87] PCT Pub. No.: WO97/40657

PCT Pub. Date: Oct. 30, 1997

[30] Foreign Application Priority Data

Apr. 23, 1996 [JP] Japan .................................. 8-100744

[51] Int. Cl.[7] .................................................. G01B 11/14
[52] U.S. Cl. ..................... 356/375; 356/372; 250/559.19
[58] Field of Search ..................... 356/375, 372, 356/388, 398, 394; 250/559.49, 235, 559.34

[56] References Cited

U.S. PATENT DOCUMENTS 5,200,799  4/1993  Maruyama et al. .
5,593,977  1/1997  Kano et al. ............................ 356/152.2
5,839,186  11/1998  Onodera ...................................... 29/720

OTHER PUBLICATIONS

Schiebel G: "Automatic Gang Bonding, The Alternative Process", Apr. 1, 1992, no Conf. 12, Apr. 1, 1992, Institute of Electrical and Electronics Engineers, pp. 146–154, XP000410409, see p. 147, line 1—p. 148, col. 3; Figure 1.
Seiji Hata: "Vision Systems for PCT Manufacturing in Japan", vol. 1, Nov. 27, 1990, Institute of Electrical and Electronics Engineers, pp. 792–797, XP000217327—see the whole document.

*Primary Examiner*—Frank G. Font
*Assistant Examiner*—Roy M. Punnoose
*Attorney, Agent, or Firm*—Wenderoth, Lind & Ponack, L.L.P.

[57] ABSTRACT

The electronic component mounting apparatus includes: a tray feed section (4) for feeding an electronic component (2) to be placed; an x-axis robot (5) and a y-axis robot (6) for moving the electronic component (2) to be placed; a head section (7) for holding and moving the electronic component; a 3D sensor (8); and an image memory for storing height data as three-dimensional image data, thus enabling the positioning and the three-dimensional component configuration check of the electronic component (2) to be accomplished simultaneously in one process.

13 Claims, 17 Drawing Sheets

Fig. 2A
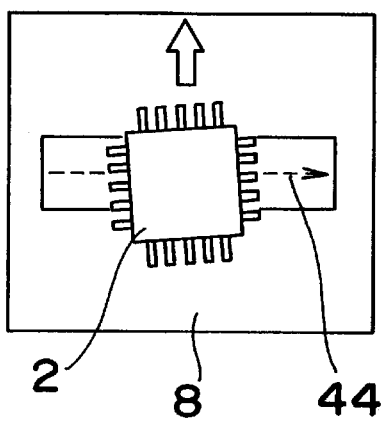
Fig. 2B
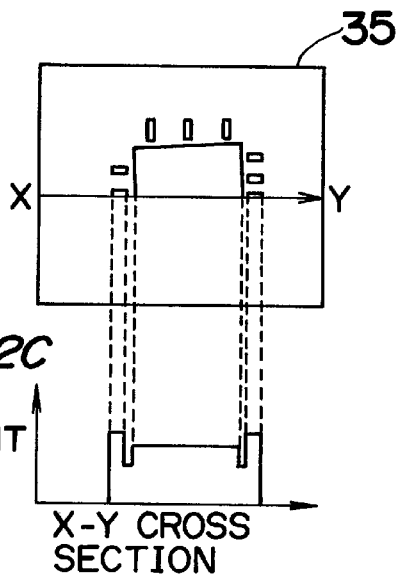
Fig. 2C
Fig. 2D
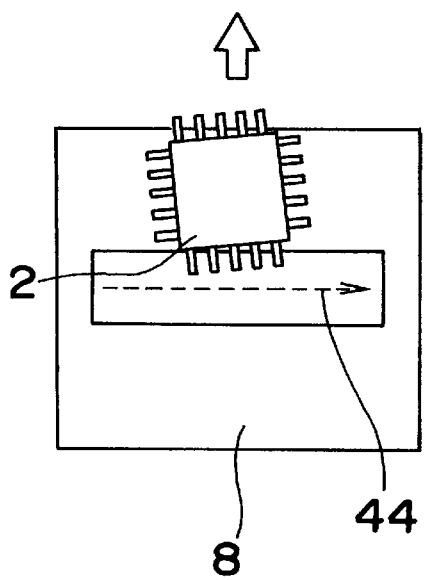
Fig. 2E
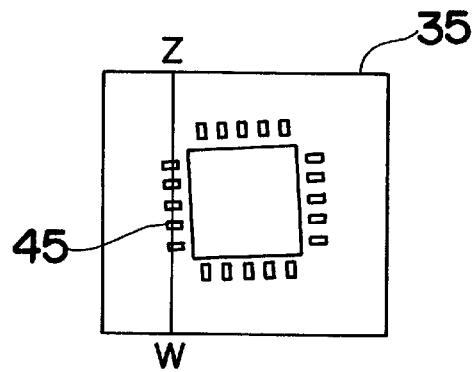
Fig. 2F
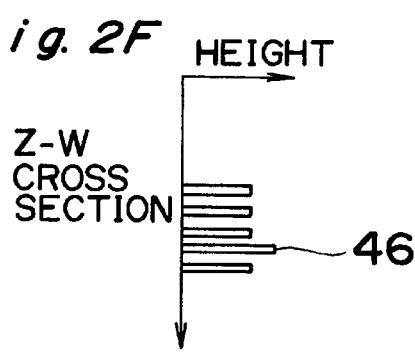

ROUGHLY DETECT
INCLINATION OF LEADS

ROUGHLY DETECT POSITIONS
OF TWO LEADS

DETECT POSITIONS OF LEADS
AT GOOD ACCURACY

ELECTRONIC COMPONENT MOUNTING APPARATUS

TECHNICAL FIELD

The present invention relates to an electronic component mounting apparatus for automatically mounting electronic components onto a board such as a printed circuit board or a liquid crystal display or plasma display panel board.

BACKGROUND ART

In electronic component mounting apparatuses, for mounting such electronic components as QFPs or connectors with narrow lead pitches and narrow lead widths, it has been conventional practice to execute automatic inspections for lead floats of components before placing the components onto the printed circuit board.

U.S. Pat. No. 5,200,799 representing the closest prior art from which the invention proceeds discloses a system for inspecting a condition of parts packaged on a printed-circuit board which system includes a position detecting device to receive scattered light due to illumination of the printed-circuit board with a laser beam and convert the received scattered light into a position signal. This position signal is used for obtaining luminance data and at least two height data of the parts on the printed-circuit board. Proper height data of the parts are determined on the basis of the difference between the two height data. The inspection system determines the package condition by comparing the final height data with predetermined reference data.

Accordingly, such optical inspection system checks the presence of poor conditions of mounted parts on a substrate such as position inaccuracy, lacks, rising and soldering fault of parts packaged or installed on the printed-circuit board.

FIGS. 9A–9D are mounting process diagrams of an electronic component mounting apparatus according to a further prior art. In most of the prior art electronic component mounting apparatus, electronic components with narrow lead pitches are mounted through a sequence of processes as shown in FIGS. 9A–9D. More specifically, in a step shown in FIG. 9A, an electronic component 2 accommodated on a tray 3 is suction-picked up by a head section 7 of the mounting apparatus. Then, in a step shown in FIG. 9B, an image of the sucked-up electronic component 2 is picked up by a positioning camera 47, and the electronic component 2 is positioned by using an image processing apparatus, by which positioning information thereabout is obtained.

In a step shown in FIG. 9C, with the use of the positioning information acquired in the step of FIG. 9B, the electronic component 2 is subjected to a coplanarity check by a lead float sensor 48 of transmission type or otherwise has an image picked up at an end portion or end portion shadow of a lead by a coplanarity checking camera 49 so that the image is subjected to a coplanarity check by the image processing apparatus.

With no abnormality found as a result of this check, in a step shown in FIG. 9D, a corrective calculation for a printed circuit board 9 as well as the electronic component 2 to be mounted thereon is executed based on the positioning information acquired in the step of FIG. 9B. Then, the electronic component 2 is placed to a specified position on the printed circuit board 9.

However, with the electronic component mounting apparatus of the prior art as described above, in the case where components are mounted through a sequence of processes to be performed in the steps as shown in FIGS. 9A–9D, because the positioning camera 47 in the step of FIG. 9B and the lead float sensor 48 or the coplanarity checking camera 49 in the step of FIG. 9C are installed physically separately and spaced from each other, there is a need of mechanically positioning the components in the step of FIG. 9C by using positioning information acquired in the step of FIG. 9B, so that the processes in the individual steps could not be simultaneously carried out, inevitably resulting in serial processing, while the components to be mounted need to be treated for move, stop, ascent/descent or other movements for the individual steps. As a result, including the operating time for the move, stop, ascent/descent or other movements of the mounting components, the processing time in the steps of FIG. 9B and FIG. 9C would have a direct effect on the whole mounting time, such that the whole mounting time would be increased by the operating time for those movements. This is disadvantageous.

Besides, when a coplanarity check is performed by the transmission-type lead float sensor 48 as in the step of FIG. 9C, it would be necessary to scan individually four physical edges of a component to be mounted, where the processing time therefor is usually 1 to 3 seconds or so. This prolonged processing would result in a great demerit in mounting a large number of QFPs or connectors, in particular. Meanwhile, also when a coplanarity check is carried out by using the coplanarity checking camera 49, a long time would be required for the coplanarity check, like the foregoing case, on account of the focusing of the camera or the capture of divisional images due to lack of resolution or the like. This also would prolong the mounting cycle time.

SUMMARY OF INVENTION

Accordingly, an object of the present invention is to provide an electronic component mounting apparatus which can reduce the mounting processing time in mounting components that require a three-dimensional configuration check, such as coplanarity check, and which can ensure both lateral and vertical pixel sizes (resolution) for picked-up images in the mounting of components, and further which can be flexibly adapted to higher speed and higher resolution (higher accuracy) of the mounting process in the case of the mounting of narrow-pitch components such as QFPs or connectors.

In accomplishing these and other aspects, according to a first aspect of the present invention, there is provided an electronic component mounting apparatus comprising:

a component feeding section for feeding an electric component to be mounted onto a board;

a head section for holding the electronic component;

a head section-moving device for moving the head section;

a three-dimensional image-acquiring device, provided at a position below a moving range of the head section, for performing, with a laser beam, line scanning of the component held by the head section to obtain, from each scanning line, positional data of a position where the component is present and height data of the component corresponding to the positional data;

an image memory for storing the height data obtained from the three-dimensional image-acquiring device as three-dimensional image data; and a control section for performing image processing for the three-dimensional image data of the electronic component.

With this arrangement, the three-dimensional image of the mounting component can be acquired by the three dimensional image-acquiring device, and image processing for this three-dimensional image can be carried out, by which the positioning of the electronic component and the three-dimensional component configuration checking can be accomplished at the same time.

As a result of this, whereas the positioning by a camera and the three-dimensional configuration characteristic such as coplanarity check would be done serially (in separate processes) in the prior art as shown in FIGS. 9A–9D, simultaneous processing of the positioning and the three-dimensional check is enabled as shown in FIGS. 10A–10C, so that the component mounting time can be reduced to a large extent, eventually. An explanation of the difference between the aspect of the present invention and the prior art shown in FIGS. 9A–9D is as follows, with reference to FIGS. 10A–10C.

FIGS. 10A–10C are mounting process diagrams in the electronic component mounting apparatus corresponding to a more specified example of the first aspect of the present invention. Referring to FIGS. 10A–10C, reference numeral 2 denotes an electronic component; 3 denotes a tray on which the electronic component 2 is placed; 7 denotes a head section for moving the electronic component 2; 8 denotes a 3D sensor as a three-dimensional image pickup means for picking up a three-dimensional image; and 9 denotes a printed circuit board which is an object onto which the electronic component 2 is mounted.

In a step shown in FIG. 10A, the electronic component 2 is picked (sucked) up from the tray 3 by the head section 7. As the electronic component 2 moves on the 3D sensor 8 along with the movement of the head section 7 in a step shown in FIG. 10B, a three-dimensional image of a bottom portion 2a of the electronic component 2 that is sucked up and moved is captured into an image memory M1 within an image processing apparatus G1 by the movement and the scanning with a laser beam 8a emitted from the 3D sensor 8. Then, image processing on this three-dimensional image is performed, by which both the positioning and the three-dimensional configuration check of the electronic component 2 are accomplished. In a step shown in FIG. 10C, the electronic component 2 is mounted onto the printed circuit board 9 based on positioning information determined by the image processing of the image processing apparatus G1.

According to a second aspect of the present invention, there is provided an electronic component mounting apparatus according to the first aspect, wherein the control section is so arranged that the three-dimensional image data of the electronic component obtained by laser-beam scanning in a direction vertical to a direction in which the electronic component is moved above the three-dimensional image-acquiring device is acquired into the image memory, while an operating speed of the moving device for moving the electronic component is made constant.

With this arrangement, in the electronic component mounting apparatus as described in the first aspect, the operating speed of the moving axis is made constant, and unnecessary stops of the component moving axis are eliminated out of the mounting operations before and after the process. Thus, the processing time in the mounting process can be reduced.

According to a third aspect of the present invention, there is provided an electronic component mounting apparatus comprising:

a moving device for moving an electronic component to be mounted onto a board;

a polygon mirror disposed at a position below the moving device;

a semiconductor laser which emits a laser beam for the polygon mirror;

a position sensing device disposed at a position around the polygon mirror; and an image-forming lens for forming as an image on the position sensing device the laser beam that has struck a bottom surface of the electronic component, wherein the semiconductor laser is so placed that its laser beam will strike the rotating polygon mirror, being thereby reflected, and strike the bottom surface of the electronic component that passes above the polygon mirror, and wherein a three-dimensional image of the electronic component obtained by computing data outputted by the position sensing device is acquired into an image memory based on a passing operation of the electronic component above the polygon mirror by the moving device and laser scanning triggered by a rotating operation of the polygon mirror, whereby a positioning of the electronic component and a configuration check thereof are performed with the three-dimensional image.

With this arrangement, the three-dimensional image of the electronic component can be acquired by a three-dimensional image-acquiring device made up of the polygon mirror, the semiconductor position sensing devices, the semiconductor laser and the like, by which the positioning and the three-dimensional configuration check of the electronic component can be accomplished simultaneously.

According to a fourth aspect of the present invention, there is provided an electronic component mounting apparatus according to the third aspect, further comprising:

a moving-amount detecting circuit for calculating a moving amount of the moving device from a reference position of the moving device;

a rotation-amount detecting circuit for calculating a rotation amount of the polygon mirror from a reference position of the polygon mirror upon reception of a rotation-amount signal of the polygon mirror; and a first comparing circuit for comparing the moving amount of the moving device and the rotation amount of the polygon mirror with each other, wherein when a difference between the moving amount of the moving device and the rotation amount of the polygon mirror as a comparison result obtained from the first comparing circuit falls within an allowable range, the data stored in the image memory is processed as effective data, while when the difference does not fall within the allowable range, the data stored in the image memory is processed as ineffective data.

According to a fifth aspect of the present invention, there is provided an electronic component mounting apparatus according to the third or fourth aspect, further comprising:

a moving-speed detecting circuit for calculating a moving speed of the moving device at each time;

a rotation-speed detecting circuit for calculating a rotation speed of the polygon mirror at each time upon reception of a rotation-amount signal of the polygon mirror;

a second comparing circuit for comparing the moving speed of the moving device and the rotation speed of the polygon mirror with each other, wherein when a difference between the moving speed of the moving device and the rotation speed of the polygon mirror as a comparison result obtained from the second comparing circuit falls within an allowable range, the data stored in the image memory is processed as effective data, while when the difference does not fall within the allowable range, the data stored in the image memory is processed as ineffective data.

With this arrangement, in the electronic component mounting apparatus as described in the third and/or fourth aspects, either one or both of the moving amount of the moving device that moves the electronic component to be mounted as well as the rotation amount of the polygon mirror and the moving speed of the moving device as well as the moving speed of the polygon mirror are monitored by way of a circuit, by which the normality of a three-dimensional image (coincidence of lateral ratio of image without any partial distortions) which is acquired by scan motions of both the moving device and the polygon mirror under independent motions is ensured. Thus, the accuracy and reliability of calculation results obtained from the processing of the three-dimensional image are ensured.

According to a sixth aspect of the present invention, there is provided an electronic component mounting apparatus according to any one of the third through fifth aspects, further comprising:

a clock rate changing means for changing a fundamental clock rate at which the three-dimensional image is acquired, wherein when a high resolution is needed for the three-dimensional image, the fundamental clock rate is made faster by the clock rate changing means while the moving speed of the moving device is made slower, and wherein when a high-speed is needed for acquiring the three-dimensional image, the fundamental clock is made slower by the clock rate changing means while the moving speed of the moving device is made faster.

With this arrangement, in the electronic component mounting apparatus as described in any one of the third through fifth aspects, the apparatus can be operated by changing the fundamental clock rate (frequency) for acquiring a three-dimensional image and by, in combination, accelerating or decelerating the moving speed of the moving device at which the object is moved. In this way, in the process of performing the positioning and the three-dimensional component configuration check of an electronic component in correspondence to the components to be mounted and without impairing the normality of the acquired image, the switching between enhancing the resolution for preference for positioning or checking accuracy, and enhancing the scanning speed for preference for speed can be implemented with simplicity.

According to a seventh aspect of the present invention, there is provided an electronic component mounting apparatus according to any one of the third through sixth aspects, further comprising:

a device for calculating a distance by which the component is moved during a time after the component is located at an image data-acquiring start position until the component is located at a valid laser beam start position of line scanning, wherein taking into consideration the distance calculated by the calculating means, positioning of the component is performed by using the three-dimensional image.

According to the above construction, when positioning of the component is performed based on the calculating result carried out by the calculating means, it can be prevented that the positioning accuracy may be deteriorated due to variation in a shift of timing, resulting in positioning with higher accuracy.

According to the above aspects of the present invention, the electronic component mounting apparatus can reduce the mounting processing time in mounting components that require a three-dimensional configuration check such as coplanarity check, and which can ensure both horizontal and vertical pixel sizes (resolution) for picked-up images in the mounting of components, and further which can be flexibly adapted to higher speed and higher resolution (higher accuracy) of the mounting for the mounting of narrow-pitch components such as QFPs or connectors.

BRIEF DESCRIPTION OF DRAWINGS

These and other aspects and features of the present invention will become clear from the following description taken in conjunction with the preferred embodiments thereof with reference to the accompanying drawings, in which:

FIGS. 2A, 2B, 2C, 2D, 2E, and 2F are explanatory views of acquiring of a three-dimensional image in the embodiment;

BEST MODE FOR CARRYING OUT THE INVENTION

Figure 1:
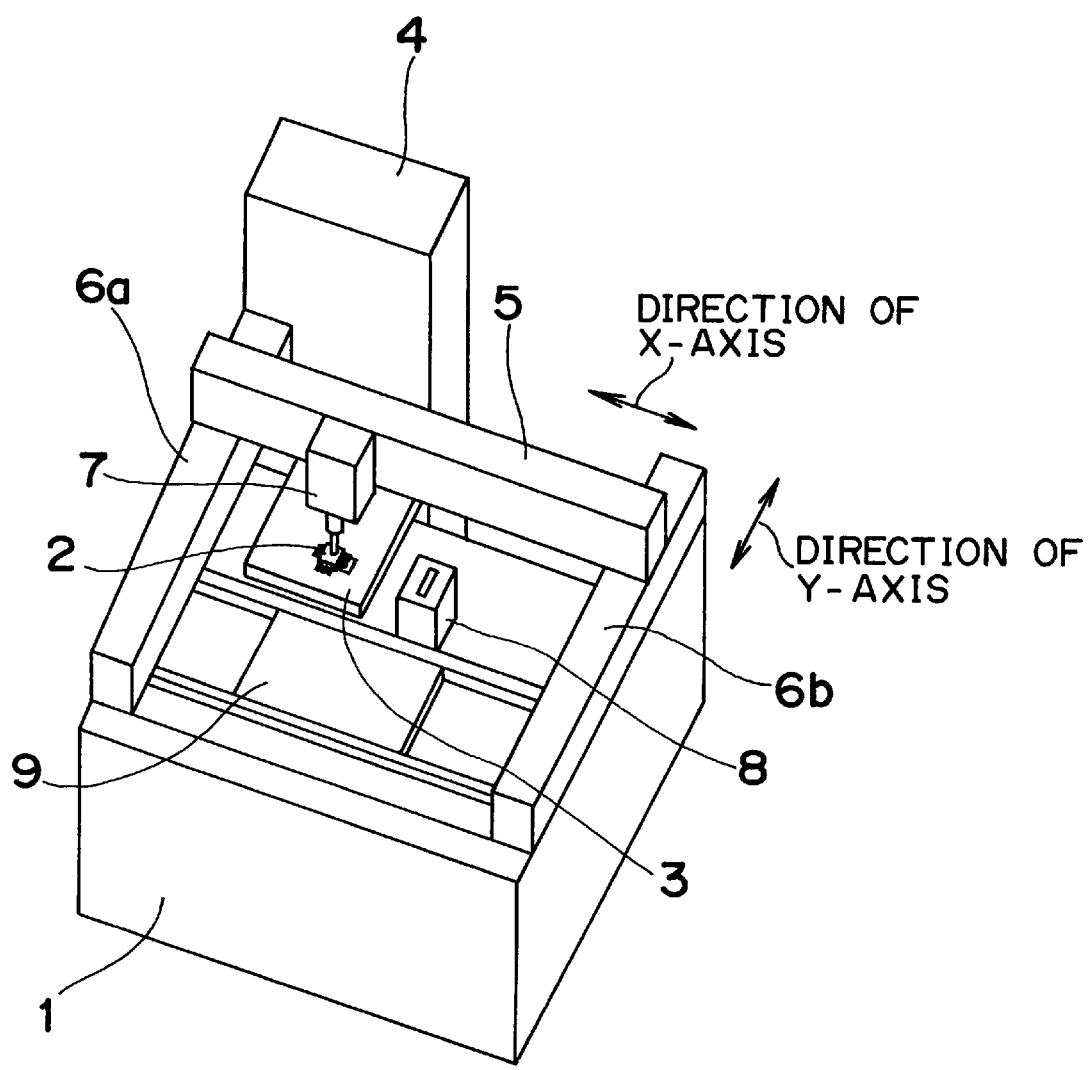
FIG. 1 is an overall schematic diagram of an electronic component mounting apparatus according to an embodiment of the present invention.

Before the description of the present invention proceeds, it is to be noted that like parts are designated by like reference numerals throughout the accompanying drawings.

Hereinbelow, an electronic component mounting apparatus showing an embodiment of the present invention is described in detail below with reference to the accompanying drawings.

FIG. 1 is an overall outline view of the electronic component mounting apparatus according to this embodiment. In FIG. 1, reference numeral 1 denotes a mounting apparatus body of the electronic component mounting apparatus, 2 denotes an electronic component to be mounted by the mounting apparatus (hereinafter, abbreviated as component), 3 denotes a tray on which the components are placed, 4 denotes a tray feeder unit as a component feeder unit for automatically feeding the components 2 placed on the tray 3, 7 denotes a head for sucking up and placing the component 2 in the mounting process, 5 denotes an x-axis-side robot (hereinafter, abbreviated as x-axis robot) which is a part of an X-Y robot serving as one example of a component or head section moving device and moves the head 7 along the x-axis, 6a and 6b denote a y-axis-side robot (hereinafter, abbreviated as y-axis robot) which is a part of the X-Y robot and moves the head 7 along the y-axis, 8 denotes a three-dimensional (hereinafter, abbreviated as 3D) sensor, which acquires a height image of the component 2. Denoted by 9 is a printed circuit board on which the component 2 is mounted.

When the component 2 placed on the tray 3 is sucked up by the head 7 and moves along the x-axis robot 5, a 3D (height) image of the component 2 is captured by the 3D sensor 8. The (height) image obtained by the 3D sensor 8 is processed in software, thereby subjected to a 3D configuration examination for the positioning, lead float or other items of the component 2. Then, according to the positioning information, the component 2 is placed to a specified position on the printed circuit board 9.

FIGS. 2A–2F are explanatory views of the capturing of a 3D image of the electronic component mounting apparatus according to the present embodiment. In FIGS. 2A–2F, reference numeral 2 denotes the component that is moved by the operation of the x-axis robot 5, 8 denotes the three-dimensional sensor, 44 denotes a laser beam scanned by a polygon mirror, 45 denotes a lead which is one of the leads of the component 2 and which is bent (floated) toward a side opposite to the placement surface, and 46 denotes height data resulting from acquiring an image of the lead 45 by the 3D sensor 8.

FIGS. 2A–2C depict how a 3D image of the component 2 is captured into an image memory 35 through steps of moving the component 2 on the 3D sensor 8, applying the laser beam 44 to the bottom surface of the component 2 by a scan of the laser beam 44 in a direction vertical to the movement of the component 2 to thereby form an image of the reflection of the laser beam 44 on a semiconductor position-sensing device, and computing outputs of the semiconductor position-sensing device sequentially to determine heights.

Data captured in individual horizontal lines of the image memory 35 are height data, as viewed from the 3D sensor 8 side, of height-computed objects located on the individual laser scanning lines (leads and package of the component 2 in this case). These data are as shown in the X-Y cross sectional view.

FIGS. 2D–2F depict a state of the image memory 35 at a time point when the component 2 has passed the 3D sensor 8. In particular, if the lead 45 is floating, the height data 46 corresponding to the lead 45 out of the Z-W cross sectional view is of greater value, compared with the other leads. This data comparison enables an examination of 3D configuration such as the lead float examination of leads.

Also, since the image memory 35 receives two-dimensional image data of the component 2, image processing of this information enables the positioning of components in the same way as the image processing using an image pickup device such as a camera, although there is a difference between brightness data and height data.

Figure 3A:
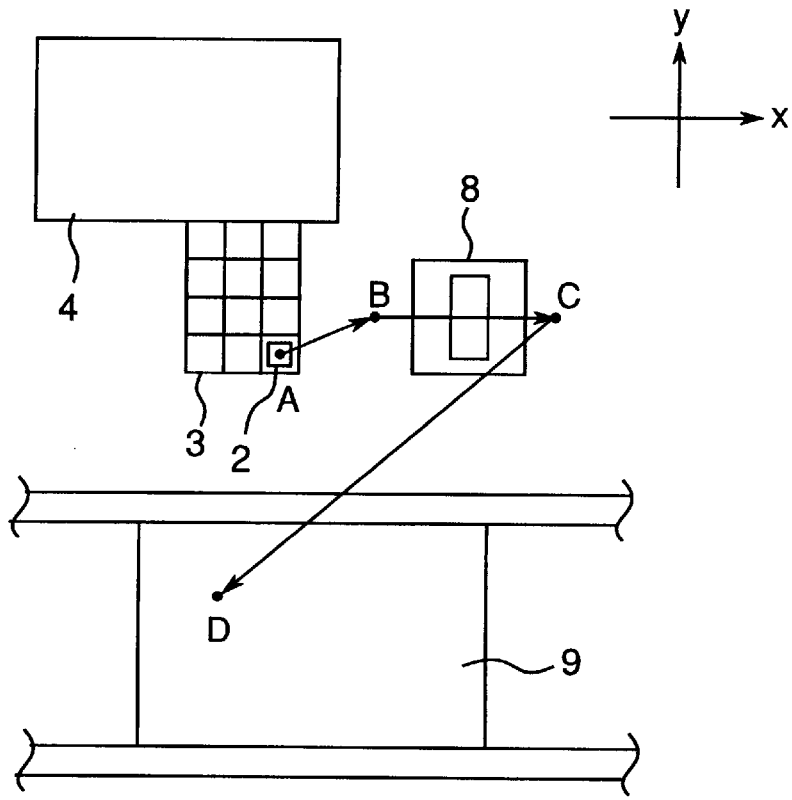
FIGS. 3A, 3B, and 3C are explanatory views of the component mounting operation in the embodiment.
Figure 3B:
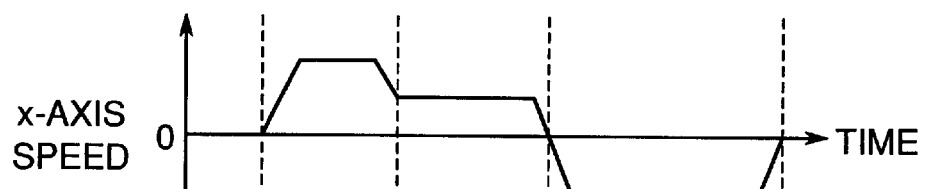
Figure 3C:
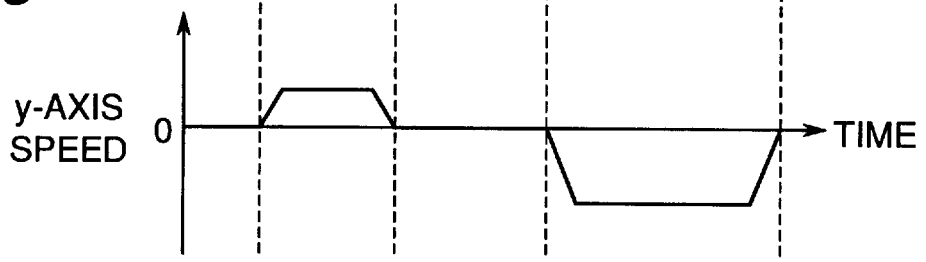

FIGS. 3A–3C are explanatory views of the mounting operation of the electronic component mounting apparatus according to the present embodiment. In FIGS. 3A–3C, reference numerals 2, 3, 4, 8, 9 denote the component to be sucked up, the tray, the tray feeder unit, the 3D sensor, and the printed circuit board on which the components are to be mounted.

In FIGS. 3A, the track represented by arrows drawn from a point A to a point B, from the point B to a point C, and from the point C to a point D represents a sequence of operations in which the component 2 is placed at a required position on the printed circuit board 9 through the operations by the electronic component mounting apparatus including the steps of: picking up the component 2 from the tray 3, allowing the component 2 to pass the 3D sensor 8, thereby acquiring a 3D image of the component 2 by the 3D sensor 8, performing the positioning and examination of the component by image processing of this image data to thereby calculate and correct the placement position.

FIGS. 3B, 3C represent how the moving operations of the individual robots in the x-axis and y-axis directions according to the track of the component 2 shown by FIG. 3A are accelerated or decelerated. In this state, the component 2 passes through above the 3D sensor 8 during the x-axis movement acquired between the point B and the point C, where a 3D image is picked up. During this process, the operating speed of the x-axis robot is constant while the y-axis robot is kept stopped.

For the rest of operation, in order to minimize the total mounting time, accelerating and decelerating operations which involve temporary stops at speed-changing points from the operation between the point A and the point B to the operation between the point B and the point C, and from the operation between the point B and the point C to the operation between point C and point D are eliminated so that the mounting operation of the machine is enhanced.

Construction and function of the 3D sensor 8 are explained in detail below.

Figure 4:
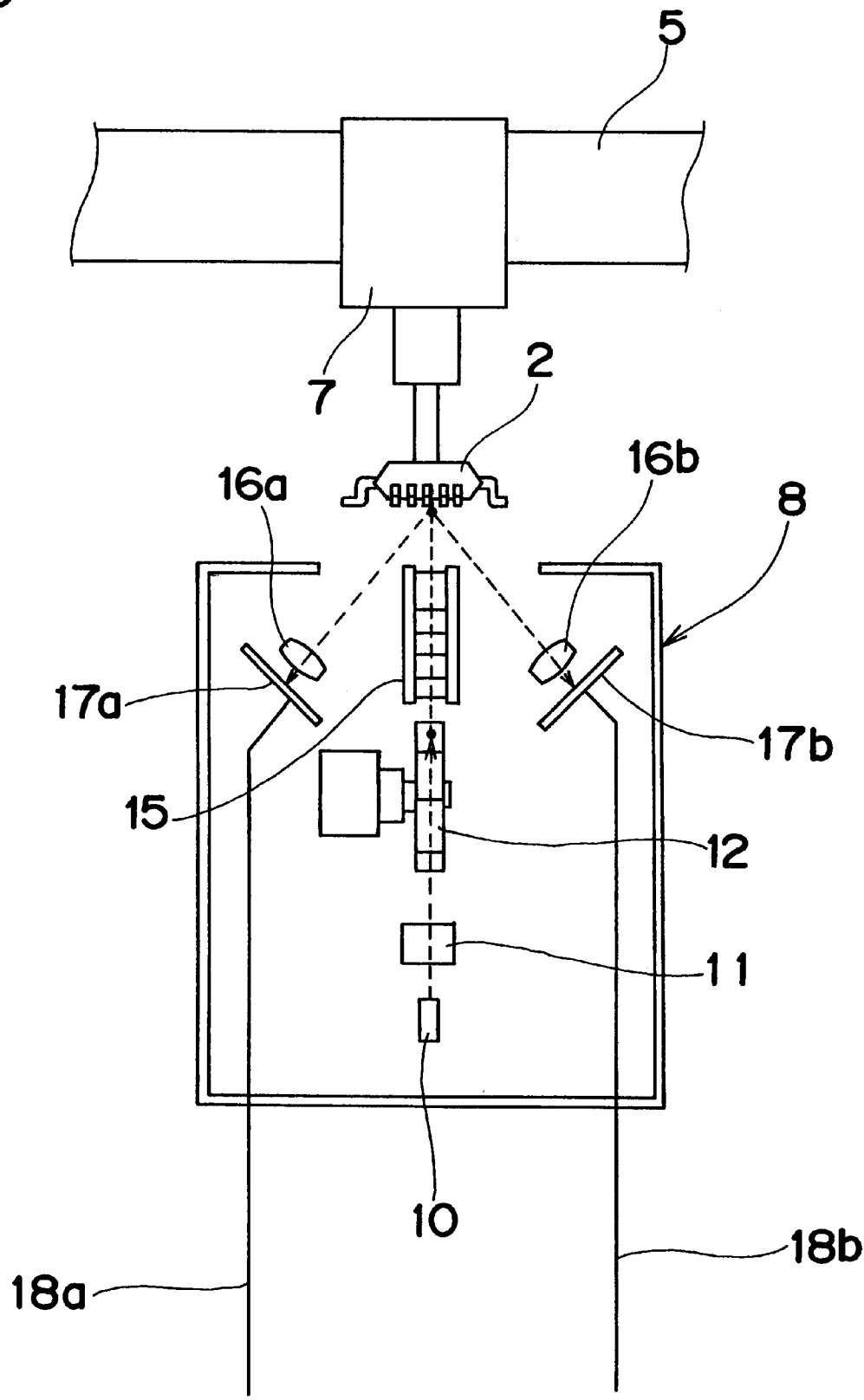
FIG. 4 is a sectional view in the x-axis direction of a 3D sensor in the embodiment.
Figure 5:
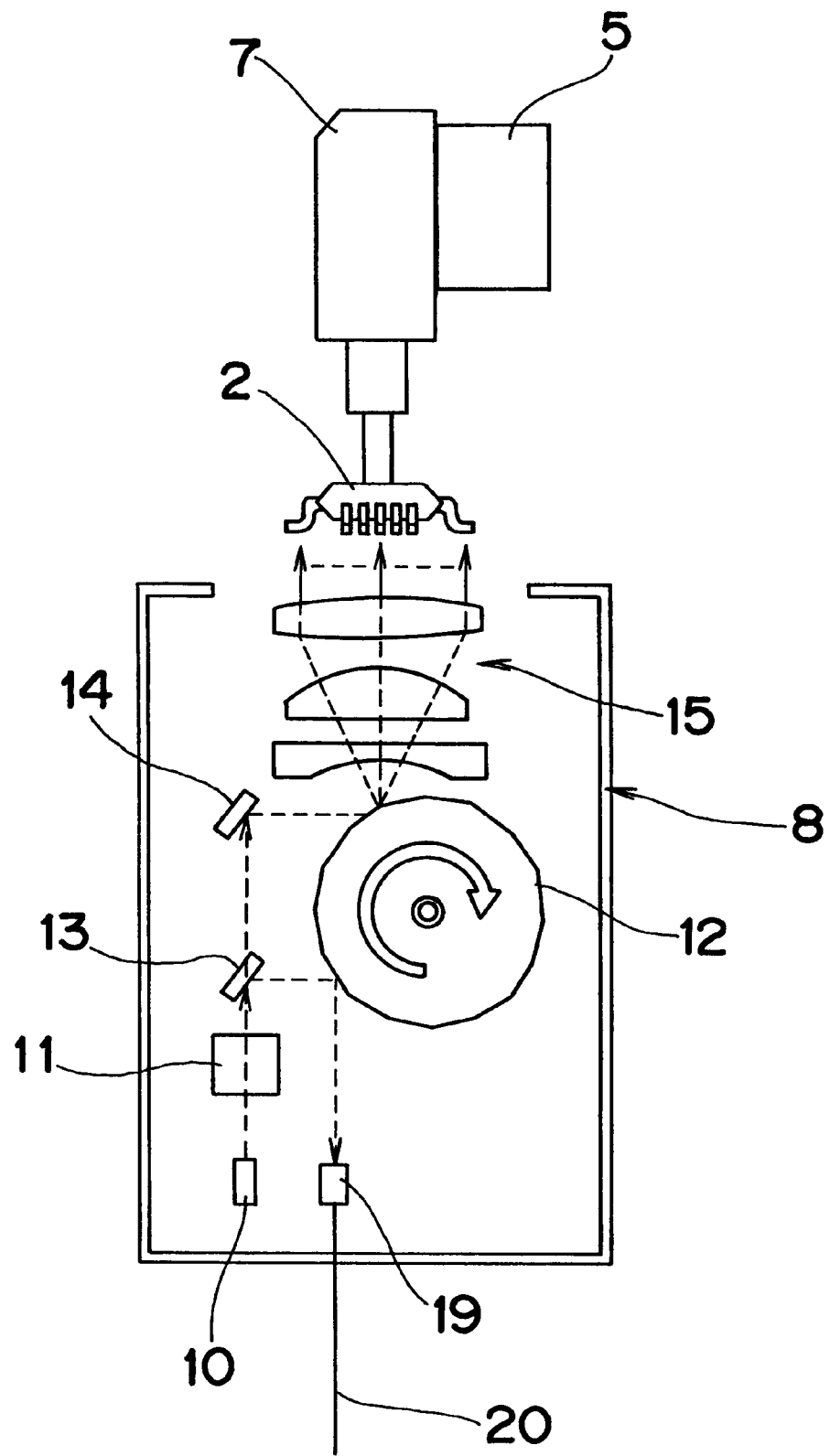
FIG. 5 is a sectional view in the y-axis direction of a 3D sensor in the embodiment.

FIG. 4 is an arrangement view (sectional view) of the 3D sensor 8 as viewed along the x-axis, and FIG. 5 is an arrangement view (sectional view) of the 3D sensor 8 as viewed along the y-axis. In FIGS. 4 and 5, reference numeral 5 denotes the x-axis robot, 7 denotes the head, 2 denotes the sucked-up component, 10 denotes a semiconductor laser for emitting a laser beam, 11 denotes a condensing-and-shaping lens for condensing and shaping the laser beam, 12 denotes a polygon mirror for scanning the laser beam that has impinged on the mirror, by mechanical rotation, 13 denotes a half mirror which passes part of the laser beam therethrough and reflects another part, and 14 denotes a mirror for reflecting light.

Further, numeral 15 denotes an F-θ lens for changing the optical path so that the laser beam swung mechanically by the polygon mirror 12 is projected vertically onto the component 2, which is the subject; 16a, 16b denote image-forming lenses which form into images the reflection (scattered light) of the laser beam that has impinged on the component 2; 17a, 17b denote semiconductor position sensing devices (hereinafter, abbreviated as PSDs) as position detecting elements on which the reflected light of the laser beam that has impinged on the component 2 forms an image through the image-forming lenses 16a, 16b, where the PSDs 17a, 17b each have a function of generating an electrical signal correlated to the position of the image-formed beam. Further, 18a, 18b denote output signals of the PSDs 17a, 17b.

In this case, the laser beam emitted from the semiconductor laser 10 is condensed and shaped in beam configuration by the condensing-and-shaping lens 11, then passing through the half mirror 13, being reflected by the mirror 14, and impinging on the polygon mirror 12. The polygon mirror 12 being in constant rotational motion, the laser beam that has impinging on the mirror surface will be swung. Further, the laser beam changed in its optical path by the F-θ lens 15 is made to vertically impinge on the component 2, and the resultant reflected light is formed into an image on each of the PSDs 17a, 17b via the image-forming lenses 16a, 16b so that the PSDs 17a, 17b generate the output signals 18a, 18b that allow the heights of the laser reflecting surfaces of the component 2 to be measured.

Further, reference numeral 19 denotes an optical sensor for detecting input of light, 20 denotes a signal that informs the outside of the fact that light has been input to the optical sensor 19. This signal 20 will change when the individual mirror surfaces of the polygon mirror 12 have come to specified angles, and, as it were, corresponds to an origin signal (indicating a surface origin) of each surface of the polygon mirror 12. Additionally, for example if the polygon mirror 12 has 18 surfaces, 18 signals per rotation are outputted when the polygon mirror 12 has rotated to angles in equal intervals (in every 20 degrees for 18 surfaces), respectively. The resulting signals are called rotation-amount signals of the polygon mirror 12.

The 3D sensor 8 in this embodiment has two systems of PSD circuits. This provision is designed primarily to compensate shortages in the case of one system of PSD circuit where upon reflection of the laser beam on the component, the reflected light may not come back to the PSD in terms of angle. Although three or more systems may be more effective, it is technically similar to the case of two systems, and so the description is made here of the two systems.

Figure 11:
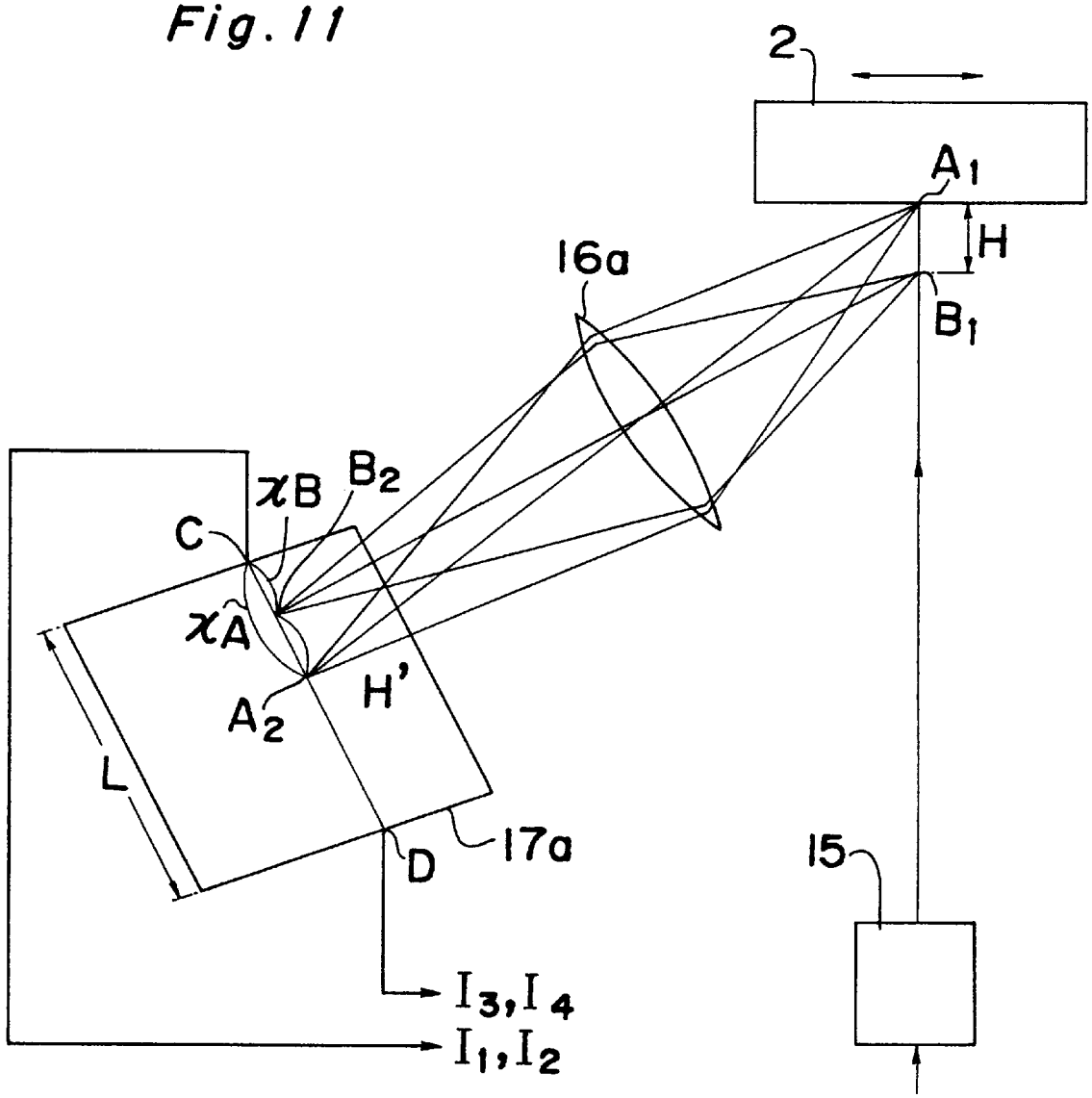
FIG. 11 is an explanatory view of an example of a method of measuring a height according to the embodiment.

Here, an example of a method of measuring a height of the component to be measured by the PSDs 17a, 17b will be representatively described in a case of the PSD 17a as based on FIG. 11.

In FIG. 11, a laser beam projected on the component 2 by scanning in a direction perpendicular to the drawing sheet of FIG. 11 from the F-θ lens 15 is irregularly reflected from the component 2. In this case, it is assumed that the projected point is a point $A_1$ of the height 0 from the bottom of the component 2 and a point $B_1$ of the height H from the bottom thereof, the scattered laser beams are formed into images by the image-forming lens 16a, and then form images on the PSD 17a at points $A_2$ and $B_2$, respectively. As a result, electromotive forces are generated at the points $A_2$ and $B_2$, and electric currents $I_1$ and $I_2$ are taken out from the point C and electric currents $I_3$ and $I_4$ are taken out from the point D. The values of the currents $I_1$ and $I_3$ are determined by resistance components in proportion to a distance $X_A$ between the points $A_2$ and C and a distance between the points $A_2$ and D, while the values of the currents $I_2$ and $I_4$ are determined by resistance components in proportion to a distance $X_B$ between the points $B_2$ and C and a distance between the points $B_2$ and D. Then, when a length of the PSD 17a is L, the $X_A$ and $X_B$ of FIG. 11 are found by the following equations:

$$x_A = L \times I_3 / (I_1 + I_3)$$
$$x_B = L \times I_4 / (I_2 + I_4)$$

Therefore, the distance H' between the points $A_2$ and $B_2$ on the PSD 17a of FIG. 11 is determined by the following equation;

$$H' = x_A - x_B$$

The above height H is determined by the determined H' on the PSD.

Next, the principle of operation in which a 3D image is formed in the electronic component mounting apparatus according to this embodiment is explained with reference to FIGS. 6 and 7.

Figure 6:
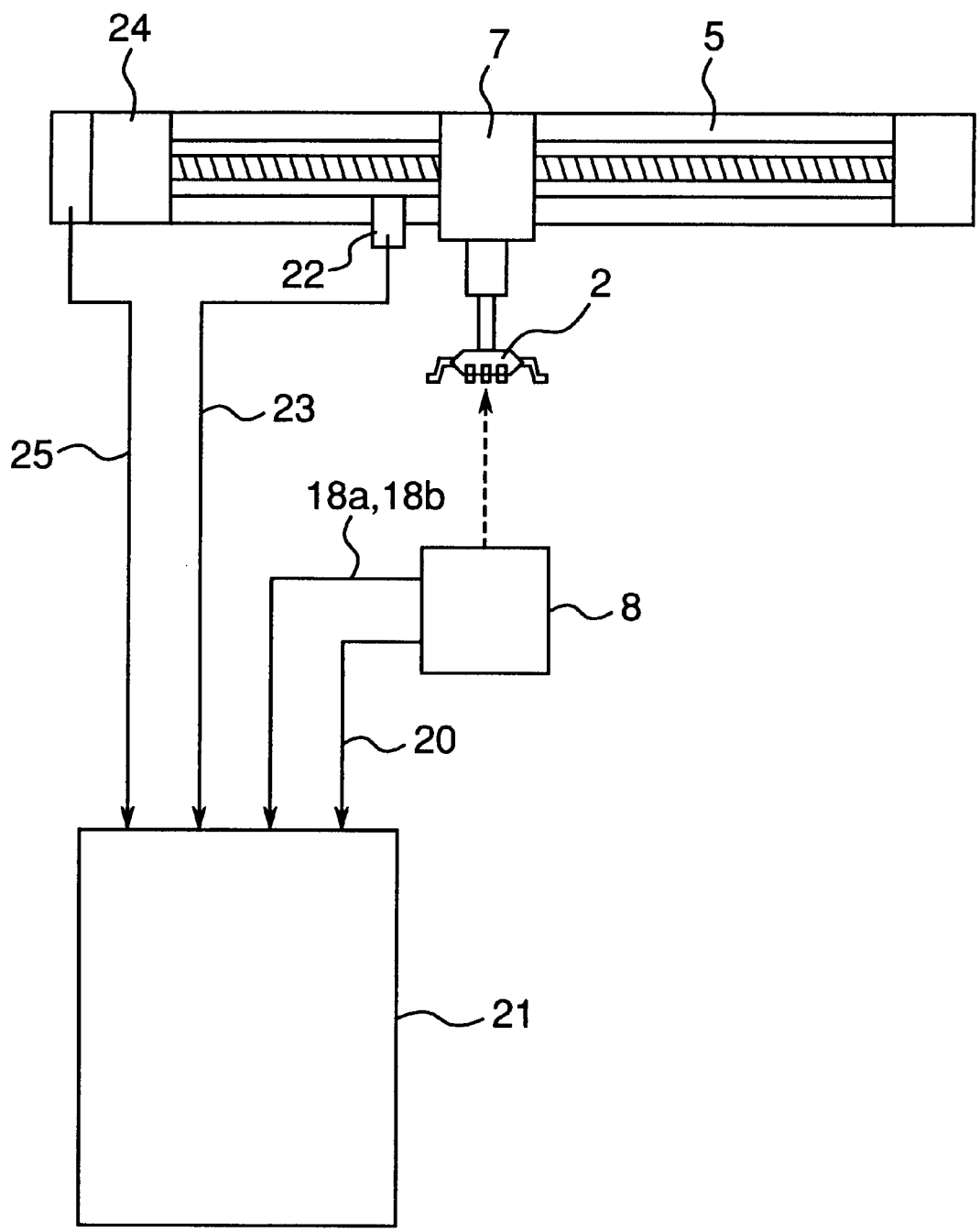
FIG. 6 is an explanatory view of output signals from the 3D sensor in the embodiment.
Figure 7:
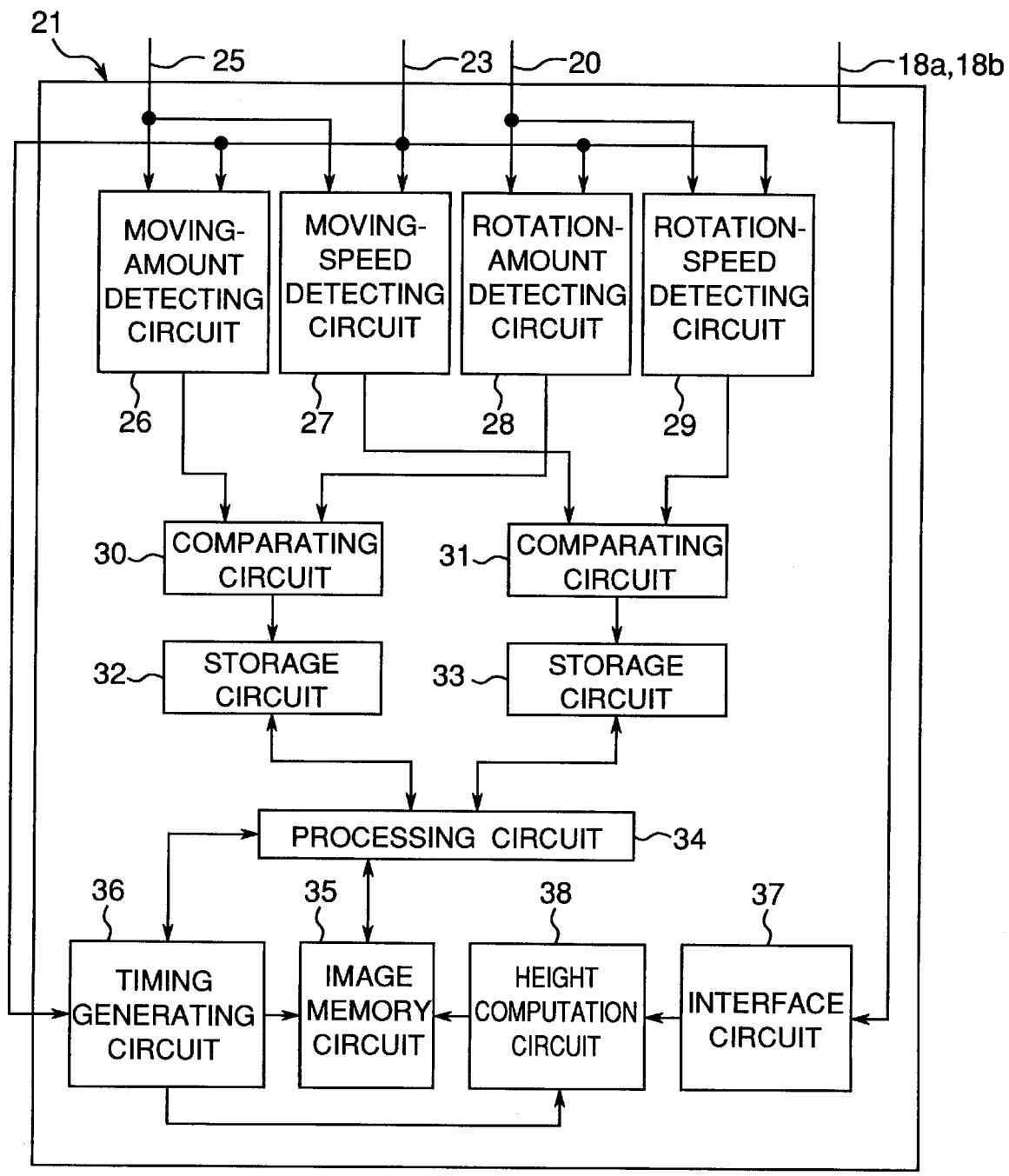
FIG. 7 is a diagram of an arrangement diagram of a main control section in the embodiment.

FIG. 6 is an explanatory view of an output signal from the 3D sensor 8 of the electronic component mounting apparatus of the present embodiment, and FIG. 7 is an internal arrangement diagram of the main control section. Referring to FIG. 6, reference numeral 2 denotes the component; 5 denotes the x-axis robot; 7 denotes the head; 8 denotes the 3D sensor; 18a, 18b denote the PSD outputs; 20 denotes the rotation-amount signal; 21 denotes a main control section of the electronic component mounting apparatus; 22 denotes a reference-position sensor for informing the main control section 21 of a reference position for the image acquiring of a 3D image on the x-axis robot 5; 23 denotes a reference-position signal for, when the head 7 has passed the reference-position sensor 22, informing the main control section 21 of it; and 24 denotes an encoder of a motor that moves the x-axis robot 5; and 25 denotes an encoder signal outputted by the encoder 24.

When the component 2 picked up from the tray 3 is moved by the x-axis robot 5, the encoder 24 keeps normally giving encoder signals (AB phase, Z phase or equivalent signal) 25 to the main control section 21. Therefore, since the reference-position signal 23 is given to the main control section 21 when the component 2 passes through the reference-position sensor 22, these two signals allow the relative position of the component 2 from the reference position on the x-axis robot 5 to be calculated by the main control section 21.

Meanwhile, the rotation amount of the polygon mirror 12 within the 3D sensor 8 is normally given to the main control section 21 as the rotation-amount signal 20 while the polygon mirror 12 is rotating. Thus, the rotation-amount signal 20 as well as the reference-position signal 23 allow the rotation amount of the polygon mirror 12 since the pass through the reference position to be calculated.

As the rotation amount of the polygon mirror 12 increases in proportion to its speed, so the moving amount of the x-axis robot 5 increases similarly. In the 3D sensor 8 in this embodiment, on the other hand, it is assumed that the polygon mirror 12 will rotate and the x-axis robot 5 will advance straight in the image-acquiring of the 3D image at equal speed to that of the rotation of the polygon mirror 12. If this condition is disturbed, the horizontal and vertical resolutions per pixel (pixel size) of the acquired 3D image would vary responsively to speed variations. This makes a factor of errors in measurement accuracy. Thus, in the electronic component mounting apparatus of the present embodiment, the 3D image is acquired into the image memory 35 located within the main control section 21 by the above-constructed 3D sensor 8, while the apparatus employs the rotation-amount signal 20 of the polygon mirror 12 as well as the encoder signal 25 of the motor to monitor and control the matching between the polygon mirror 12 that basically executes equal-speed rotational motion and the head 7 that is driven by the motor such as a servo motor.

Referring to FIG. 7, reference numeral 26 denotes a moving-amount detecting circuit for calculating a moving amount (distance) from a reference position of the x-axis robot 5 upon reception of the encoder signal 25; 27 denotes a moving-speed detecting circuit for calculating a moving speed at each time of the x-axis robot 5 upon reception of the encoder signal 25; 28 denotes a rotation-amount detecting circuit for calculating a rotation amount from the reference position of the x-axis robot 5 upon reception of the rotation-amount signal 20 of the polygon mirror 12; 29 denotes a rotation-speed detecting circuit for computing a rotation speed at each time of the polygon mirror 12 upon reception of the rotation-amount signal 20; 30 denotes a first comparing circuit for making a comparison of moving amounts between the motion of the x-axis robot 5 and the rotation of the polygon mirror; 31 denotes a second comparing circuit for making a comparison of moving speeds between the motion of the x-axis robot 5 and the rotation of the polygon mirror; 32, 33 denote storage circuits for storing comparison, results of the comparing circuits 30, 31, respectively; 34 denotes a processing circuit for controlling and monitoring the whole main control section 21; 35 denotes an image memory for acquiring or storing the 3D image (height image); 36 denotes a timing generating circuit for generating various types of timing signals to acquire PSD outputs 18a, 18b delivered by the 3D sensor 8; 37 denotes an interface circuit for allowing the main control section 21 to receive the PSD outputs 18a, 18b; and 38 denotes a height computation circuit for converting and correcting the PSD outputs 18a, 18b into height signals.

The PSD outputs 18a, 18b generated by the 3D sensor 8 are inputted to the main control section 21 by the interface circuit 37. The inputted PSD outputs 18a, 18b are basically raw signals outputted by the PSDs 17a, 17b. In order that the height image is processed by software-like manner, it is necessary to perform various types of computations such as height conversion and corrective calculations on the PSD outputs 18a, 18b, and this is done by the height computation circuit 38. A signal computed by the height computation circuit 38 is acquired into the image memory 35 as height data, and subjected to various types of software processing by the processing circuit 34.

The acquiring of height data into the image memory 35 is executed sequentially on the individual horizontal lines of the image memory 35. In this case, the rotation-amount signal 20 of the polygon mirror 12 is used as a synchronization signal (reference signal) for the individual polygon surfaces.

In such a sequence of image-acquiring operation, the operation of the x-axis robot 5 (i.e., movement of components targeted for image-acquiring) and the operation of the polygon mirror 12 are executed independently of each other. In more detail, based on the encoder signal 25, the moving amount and speed of the x-axis robot 5 are calculated by the moving-amount detecting circuit 26 and the moving-speed detecting circuit 27, respectively. Then, based on the rotation-amount signal 20 of the polygon mirror 12, rotation-amount and -speed of the polygon mirror 12 are calculated by the rotation-amount detecting circuit 28 and the rotation-speed detecting circuit 29, respectively. The moving amounts and speeds of the x-axis robot 5 and the polygon mirror 12 are compared with each other by the comparing circuits 30, 31, respectively, and the comparison results are stored in the storage circuits 32, 33. In this way, synchronized operation between the movement of the x-axis robot 5 and the rotation of the polygon mirror 12 is monitored and controlled.

As an example of the monitoring, in each of the comparing circuits 30, 31, when the difference obtained from the comparison result falls within an allowable range, the data stored in the image memory is dealt with as effective data. When the difference does not fall within the allowable range, the data stored in the image memory is dealt with as ineffective data. That is, it may be such that any comparison error larger than a specified level is taken as an image-acquiring fault and followed by one more method of acquiring the image, or that, by referencing the comparison result, the 3D image in the image memory 35 is processed for normalization, correction or other processing with software or an additional circuit provided.

Here, one example for converting the rotation-amount of the polygon mirror 12 into the moving amount will be described below.

It is supposed that the polygon mirror 12 a dodecahedron and it is so designed that the component 2 is moved by 40 $\mu$m when the polygon mirror 12 is rotated by 30 degrees (=360°/12). At that time, when the rotation-amount of the polygon mirror 12 after the image-acquiring is started is 125.5 rotation, the component 2 is moved by 60,240 ($\mu$m) [=125.5(rotation)×12 (surface/rotation)×40($\mu$m)].

In order to realize this operation in circuits, the pulse number of the rotation-amount signal 20 from the polygon mirror 12 (the number of the signals from each surface origin which is a reference point of each surface of the polygon mirror 12) are counted during the image-acquiring operation. In the above example, when the polygon mirror 12 is rotated by 125.5 rotations, the number of the surface origins are counted by 1,506 [=125.5 (rotations)×12 (the numbers of the surface origins)]. Therefore, when the pulse numbers of the rotation-amount signal 20 are 1,506, it may be considered that the component is moved by 40 $\mu$m and then, the rotation-amount of the polygon mirror 12 can be converted into the moving amount.

Figure 8:
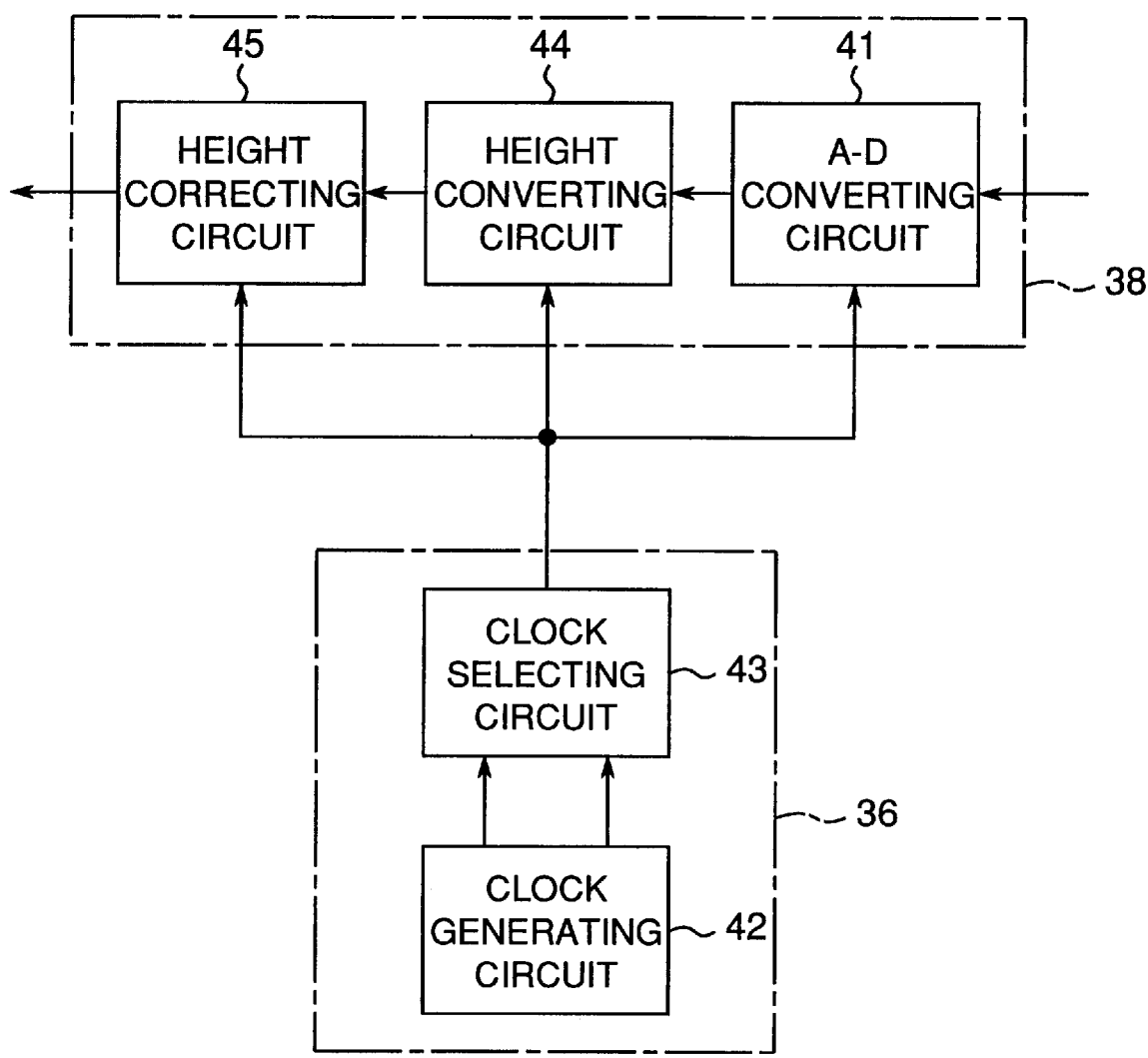
FIG. 8 is a diagram of an internal arrangement diagram of a height computation circuit in the embodiment.
Figure 9A:
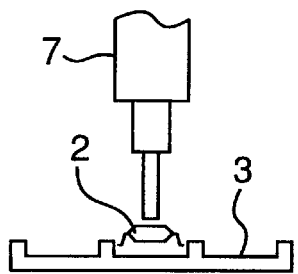
FIGS. 9A, 9B, 9C, and 9D are mounting process diagrams in an electronic component mounting apparatus according to the prior art.
Figure 9B:
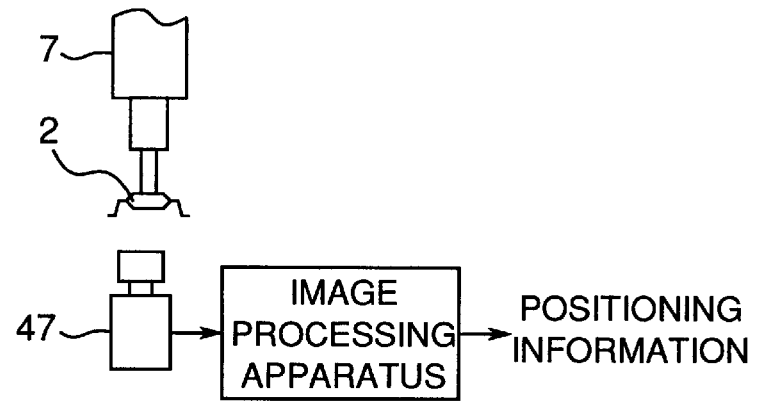
Figure 9C:
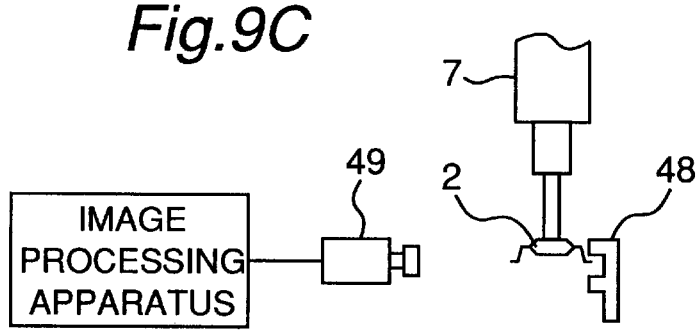
Figure 9D:
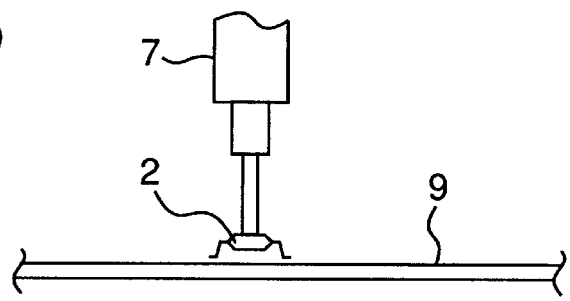
Figure 10A:
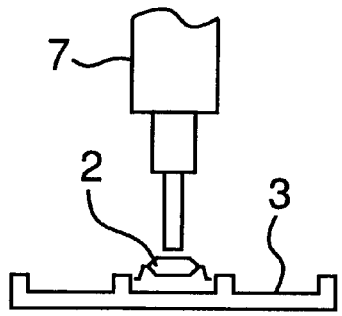
FIGS. 10A, 10B, and 10C are mounting process diagrams in the electronic component mounting apparatus according to an embodiment of the present invention.
Figure 10B:
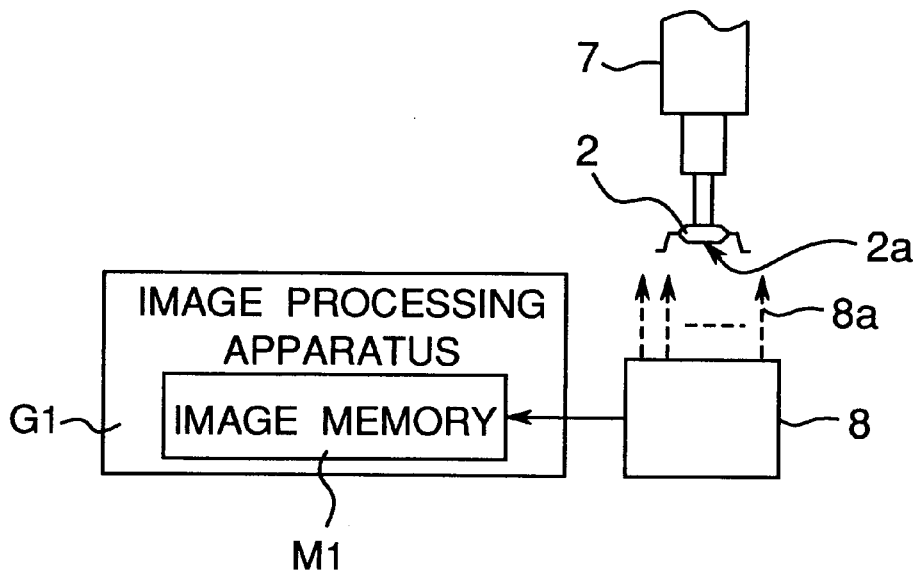
Figure 10C:
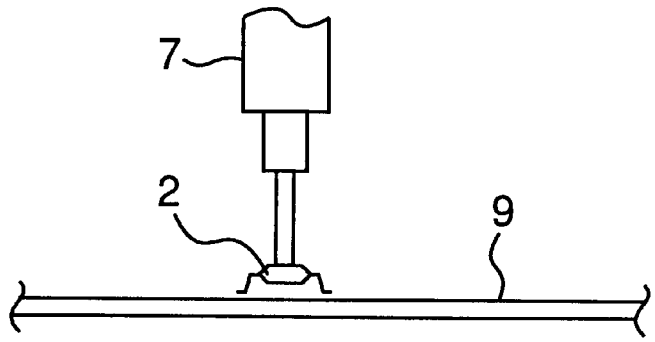

FIG. 8 is an internal arrangement view of the height computation circuit 38. Reference numeral 41 denotes an A–D converting circuit for performing analog-to-digital conversion on the PSD outputs 18a, 18b; 42 denotes a clock generating circuit; 43 denotes a clock selecting circuit as a clock rate changing means for giving a clock of one rate (frequency) to the A–D converting circuit 41 or the image memory 35 by selecting one from among a plurality of clocks generated by the clock generating circuit 42; 44 denotes a height converting circuit for performing calculations on the PSD outputs 18a, 18b by the principle of triangulation; and 45 denotes a height correcting circuit for correcting the non-linear relation between the position of a beam formed into an image on the surfaces PSDs 17a, 17b and the position of the laser beam impinging on the measurement object. In this case, clocks of two or more kinds of frequencies generated by the clock generating circuit 42 are selected by the clock selecting circuit 43, and the selected clocks are given to necessary circuits within the main control section 21, such as the A–D converting circuit 41 and the image memory 35, which require these signals, while the operating speed of the x-axis robot is increased or decreased inversely proportional to the speed of these clocks. Thus, it becomes possible to change the resolution without adding any special circuit, while maintaining the horizontal and vertical pixel sizes of the acquired image (3D image). For example, assume that when A–D conversion is performed at 4 MHz and the x-axis robot is operated at 100 mm/s, the horizontal and vertical pixel sizes are 50 μm, equal to each other. In this case, if the clock of 8 MHz is selected and given to the necessary circuits and if the x-axis robot is operated at 50 mm/s, then the pixel size (resolution) of the image to be acquired can be a 25 μm pixel.

In this case, the data quantity per line (horizontal line) doubles, while this is the case also with the vertical direction. Therefore, an attempt to acquire an image of a doubled resolution to the same field-of-view size would require a four times larger capacity of the image memory 35. This depends on whether to select the enlargement of the image memory 35 or to restrict the field-of-view size of the image memory 35 in use with the resolution enhanced.

Next, the relationship between individual signals and the image-acquiring and image-processing operations performed by the main control section 21 of FIGS. 7 and 8 will be described based on FIGS. 7, 8, 12, and 13.

The motor is provided in the x-axis robot 5 which moves the head section 7 sucking up the component 2. An AB phase signal indicating a normal moving distance of the x-axis robot 5 and a Z phase signal indicating a fixed position (a certain rotary angle of the motor) are outputted from the encoder attached to the motor.

On reception of both of the Z phase signal and the position detecting sensor signal from the position detecting sensor (which is constructed by a photo-sensor or Hall element etc. as an example) for detecting the reference position, the image data-acquiring operation is started.

Figure 13:
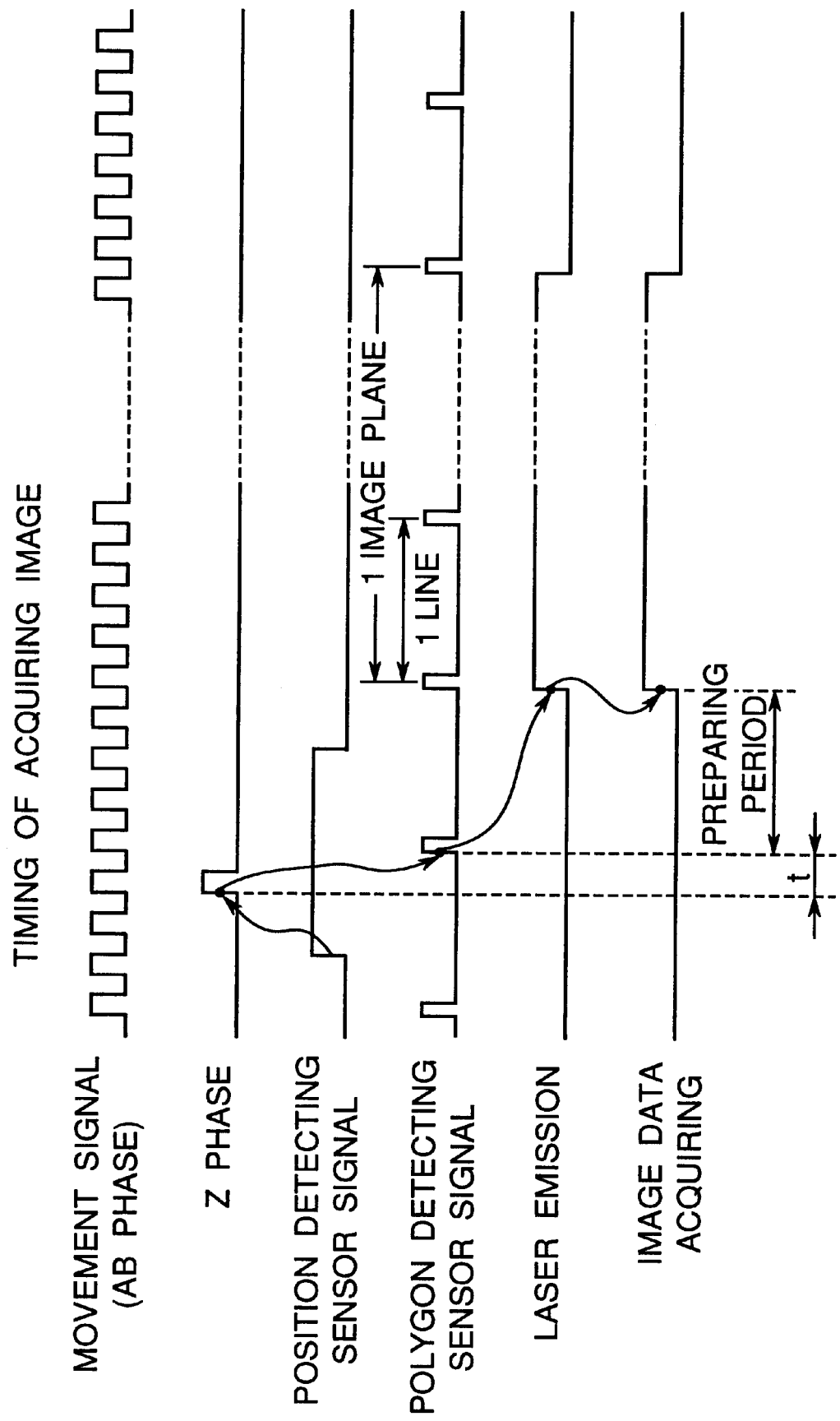
FIG. 13 is a timing chart showing timing of image-acquiring in the embodiment.

Since the time or period after the Z phase signal and the sensor signal are received until the image data-acquiring operation is started is very short, as shown in FIG. 13, a sequential operation of the laser beam emission and the image data-acquiring operation is automatically performed in synchronization with the rotation-amount signal indicating the surface origins of the polygon mirror 12 by a hardware, not by the processing circuit 34. In order to perform such an operation, the timing generating circuit 36 outputs an image data-acquiring timing. By the output of the image data-acquiring timing, the image data of, for instance, 1,000 lines are acquired. In such a manner, the time for acquiring the rotation-amount signal 20 is dealt with as the reference position (surface origin of each surface of the polygon mirror 12), and is determined as a start reference for acquiring the image data. For example, when the image data of one thousand lines per component are acquired, the image-acquiring operation is automatically completed for the component by acquiring the image data of 1,000 lines.

Figure 12:
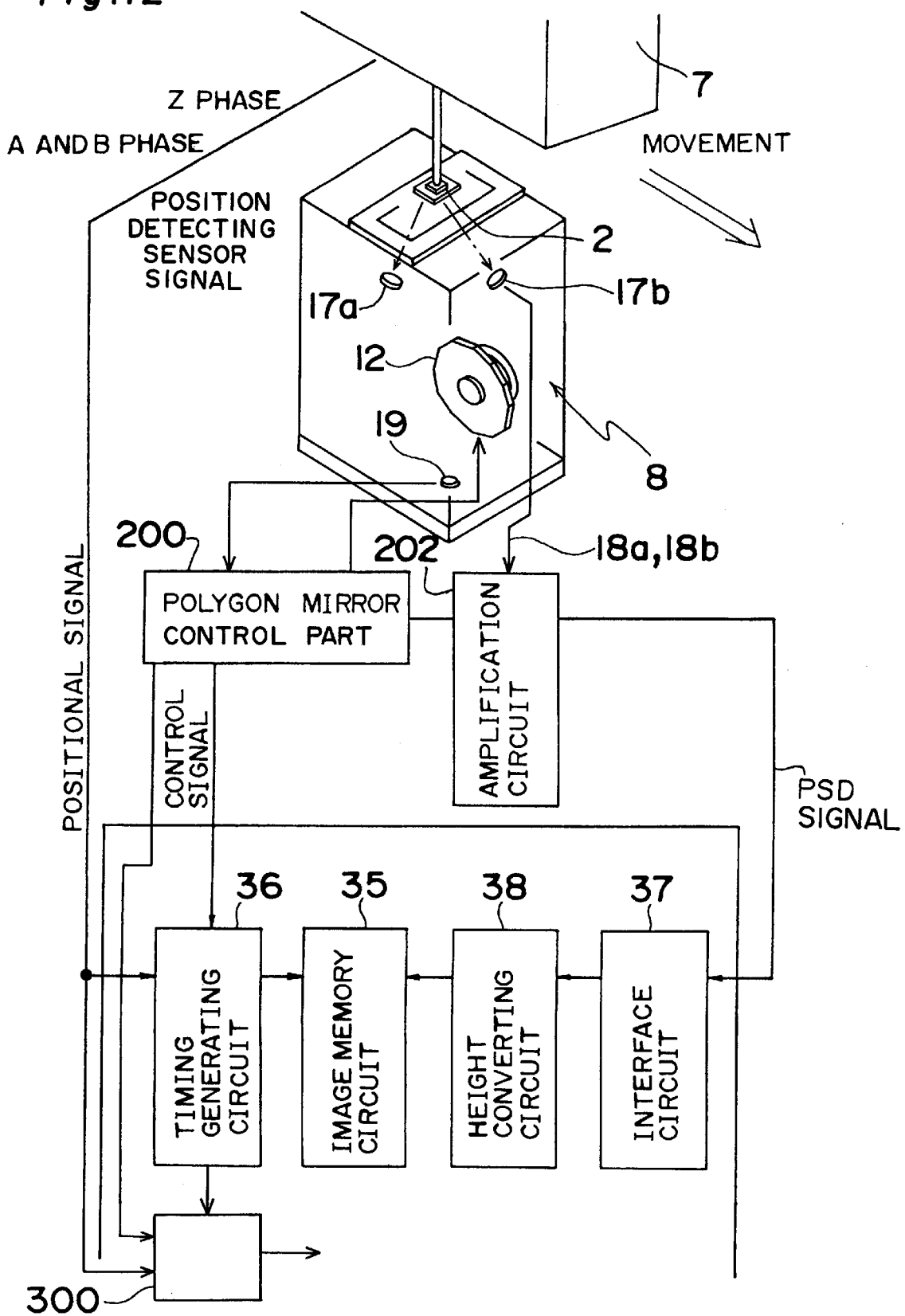
FIG. 12 is an explanatory view of relationship between a main control section and individual devices in the embodiment.

The two analog signals are inputted in the above manner from each of the PSD outputs 18a, 18b, and then are amplified by an amplification circuit 202 as shown in FIG. 12. Thereafter, these two analog signals are analog-digital-converted by the A–D converting circuit 41 of the height computation circuit 38 via the interface circuit 37. Thereafter, the above-described height computation is performed based on each of the two signals which are digitalized from the PSD outputs 18a, 18b to calculate lead height positions. Here, if a value of the digitalized signal falls within an allowable range, the data is dealt with as the normal data to sequentially process it. If the value does not fall within the allowable range, the data is ignored. That is, in the two PSD outputs 18a, 18b, if one of the outputs falls within the allowable range, only the PSD output within the allowable range is used. If the values of both of the PSD outputs fall within the allowable range, an average value between the values of the PSD outputs is used. If both of the values of the PSD outputs do not fall within the allowable range, the PSD outputs are not processed in the sequential processes to be dealt with as error generation.

After the lead height data is computed in such a manner, the height correction is performed by the height correcting circuit 45. This height correction should be performed because of a fact that even though positions of incident beams on the PSDs 17a, 17b are linearly changed, the corresponding positions on the PSDs 17a, 17b are not linearly changed. The height correction is performed by preliminary storing tables or curved equations for correction and correcting the computed height data based thereon, resulting in obtaining accurate height data.

The height-corrected height data is inputted into the image memory circuit 35 while timings obtained from the timing generating circuit 36 are stored as addresses.

Then, based on data stored in the storage circuit 32 as a comparison result in the comparing circuit 30 between the rotations-amount detecting circuit 28 and the moving-amount detecting circuit 26, it is decided whether or not the image data falls within an allowable range. If it does not fall within the allowable range, the image data stored in the image memory circuit 35 is dealt with as ineffective data. If the image data falls within the allowable range, the data stored in the image memory circuit 35 is read out by the processing circuit 34 to perform the image processing such as the positioning of the component.

Figure 14:
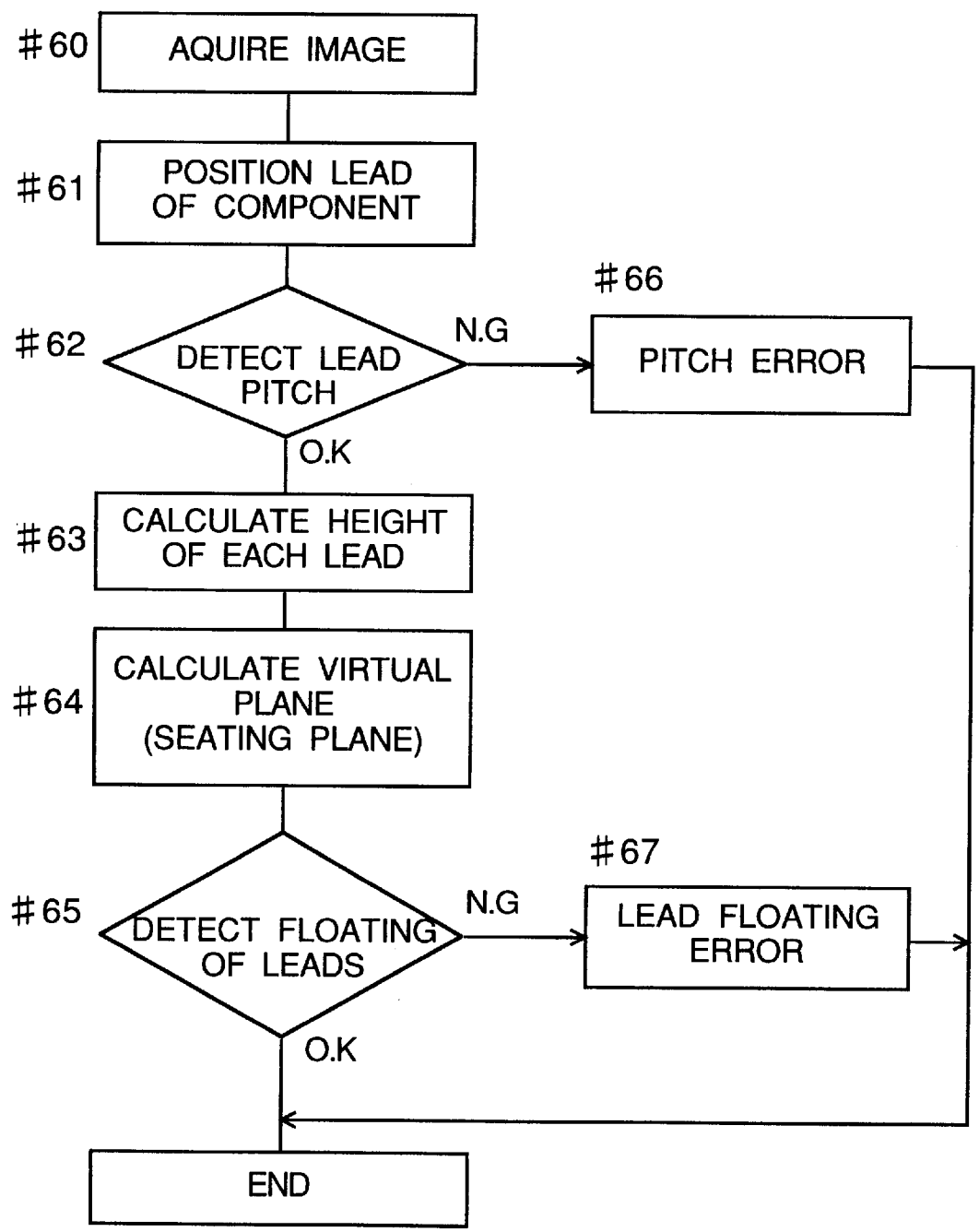
FIG. 14 is a flowchart showing operations from image-acquiring to image processing in the embodiment.

Hereinbelow, in more detail, one example of a flow of the image-acquiring operation and the acquired image-processing operation with respect to one of the components 2 is shown in FIG. 14 as a flowchart.

As shown in FIG. 14, firstly, the image-acquiring of the component 2 is performed at step #60.

Figure 15A:
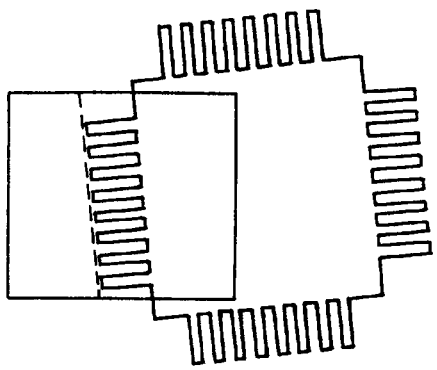
FIGS. 15A, 15B, and 15C are explanatory views of an algorithm as one example relating to lead recognition of the component in sequential order.
Figure 15B:
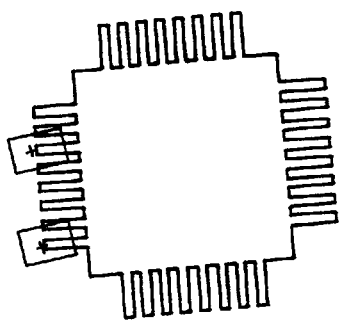
Figure 15C:
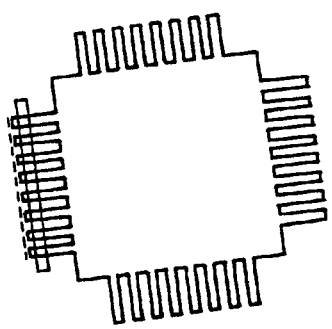

Next, at step #61, the positioning of the leads of the component 2 the image of which has been acquired is performed. As the positioning, although there are various kinds of methods (algorithms), a typical example thereof will be described below. This positioning is preferably performed in the following manner. First, as shown in FIG. 15A, the inclination of the leads at one side of the quadrangular component 2 such as QFP is roughly detected. Next, as shown in FIG. 15B, positions of the two leads arbitrarily selected among the detected leads are roughly detected. Finally, as shown in FIG. 15C, the lead positions at one side of the component are detected with good accuracy based on the roughly-detected lead positions. In such a manner, when the lead positions at the one side of the quadrangular component 2 such as QFP are detected, the remaining lead positions may be detected with good accuracy as shown in FIG. 15C with respect to the leads at the remaining sides, based on the detected lead positions at the one side.

Figure 17:
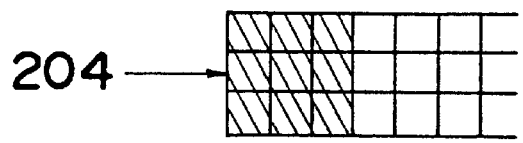
FIG. 17 is an explanatory view of height computation of each lead of the component.

Next, it is decided at step #62 whether or not the lead pitch is acceptable. If acceptable, the height computation of each lead is performed at step #63 in the below-described manner. In the height computation, as shown in FIG. 17, the height information (which is data themselves stored in the image memory) of a plurality of pixels (corresponding to each small square in FIG. 17) around a lead end portion 204 (oblique line portions in FIG. 17) of each lead is averaged based on the lead position information obtained at step #61 to obtain the lead heights. The three-dimensional position of each lead is information $(x_i, y_i, z_i)$ found by adding the lead heights to the positions of the individual leads found through the positioning operation, where i=1, . . . , n (n is a number of leads).

Next, at step #64, a virtual plane (seating plane) is calculated. Here, the virtual plane will be described below.

Figure 16A:
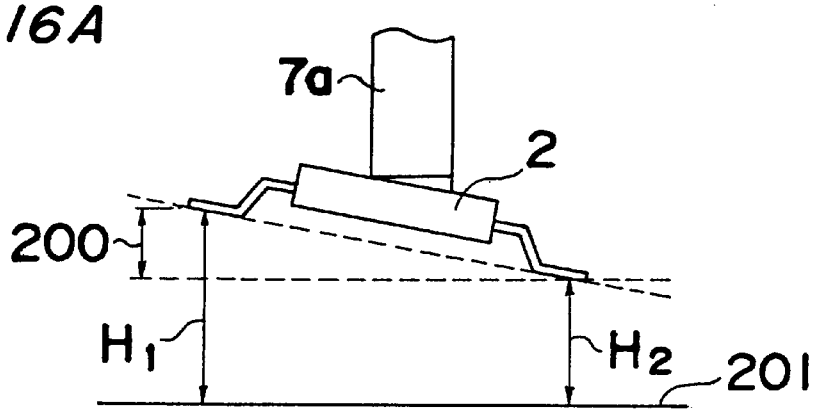
FIGS. 16A, 16B, and 16C are explanatory views relating to a method of measuring lead floating of the component.

Generally, when components each having a plurality of leads such as QFPs are mounted on a board, it is possible that a part of leads of the component is separated from the electrodes of the board, which is called a lead float state. A lead float detection for detecting the lead float of the component before mounting on the board is performed at step #65. When this processing is performed in a condition where the component is sucked by a nozzle, as shown in FIG. 16A, it is possible that the component 2 is sucked up by the nozzle 7a with the component 2 inclined. Therefore, accurate lead float cannot be found simply by calculating the height of each lead due to such an inclination of the component. Then, the virtual plane which is a contact plane on which the component is mounted is found, and a distance from the virtual distance to each lead is needed to evaluate its lead float amount. In FIG. 16A, a reference numeral 201 denotes a reference plane and 200 denotes an error ($H_1$–$H_2$) between heights of two leads due to the inclination caused in the component 2 sucked by the nozzle 7a.

The above virtual plane 202 is a plane constructed by three lead positions of the component 2, and a plane satisfying the following two conditions can be served as constructing points of the virtual plane 202.

Figure 16B:
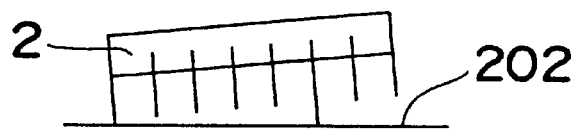

(1) As shown in FIG. 16B, all lead positions are above or on the virtual plane 202.

Figure 16C:
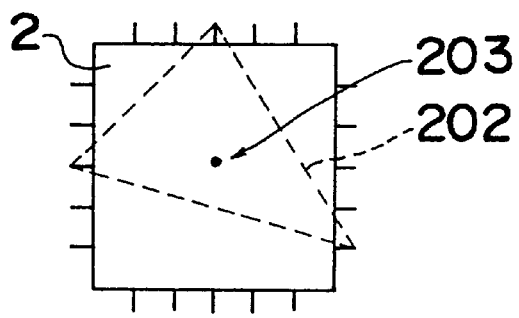

(2) As shown in FIG. 16C, a point (gravity center-projected point) 203 at which the gravity center of the component 2 is projected on the virtual plane 202 is present within a triangle defined by three points of the lead positions constructing the virtual plane 202.

Next, based on the heights computed at step #63 and the virtual plane found at step #64, it is decided at step #65 whether or not the lead float amount falls within an allowable range. The lead float amount is found by calculating a distance between the lead and the virtual plane found from the three-dimensional position of the lead in all of the leads. The distance means the lead float amount of each lead from the virtual plane. If the value of the lead float amount falls within the allowable range, the image processing operation is completed. If the value does not fall within the allowable range, the image processing operation is completed as lead float error generation at step #67. If the lead pitch does not fall with the allowable range at step #62, the image processing operation is completed as pitch error generation at step #66.

Next, one example of a correcting process of correcting a shift of the image-acquiring timing will be described below.

FIG. 12 is a diagram indicating the relationship between the main control section 21 of FIG. 7 and the individual devices, in which the detecting circuits 26–29, the comparing circuits 30, 31, the storage circuits 32, 33, and the processing circuit 34 are shown by a single polygon mirror control part 200. FIG. 13 is a timing chart showing the image-acquiring timing.

In FIGS. 12 and 13, when the component 2 is located at a specified position in accordance with the movement of the head section 7, the 3D sensor 8 outputs the position detecting sensor signal, and the polygon mirror control part 200 is in a preparing operation for acquiring the image data at a timing of the Z phase generation that is one of the outputs from the encoder of the motor for moving the component and that ensures a fixed position.

After the part 200 has been in the preparing operation, actual image data is acquired for each one line in synchronization with the detecting operation of the surface origins of the polygon mirror 12. That is, the rotation-amount signal 20 indicating the surface origins of the polygon mirror 12 is detected, and then the image acquiring is performed at the same as laser beam emission of the semiconductor 10.

At that time, as shown in FIG. 13, there is a time lag after the head section 7 is located at the image data-acquiring start position until the image data acquisition actually started. The time lag includes an amount t by which the component 2 might be moved before the image acquiring operation because of asynchronization of the operations of the head section 7 and the polygon mirror 12, and a delay caused as a preparing period which is a fixed time due to the setup of the circuits.

After the time lag, the image of one frame is acquired in synchronization with the polygon mirror 12.

Therefore, a distance by which the component 2 is moved after the component 2 is located at the image data-acquiring start position of the 3D sensor 8 until the polygon mirror 12 of the 3D sensor 8 is located at a scanning start position is found by counting the encoder outputs (AB phase) of the motor for moving the component 2 by a counting circuit 300 to output the result to the processing circuit 34. Then, based on the found result, a positioning of the component 2 is performed, resulting in preventing the positioning accuracy from being deteriorated due to variation of the shifts of the timing. Thus, the positioning can be performed with higher accuracy.

Although the component 2 is sucked up by the single suction nozzle of the head section 7 in the above embodiments, the present invention can be applied to a case where the head section 7 has a plurality of nozzles. In such a case where a plurality of components are respectively sucked up by the plurality of nozzles, when positioning and component configuration check is sequentially performed and, for example, image data of 1,000 lines per component are acquired, image data of 4,000 lines are acquired with respect to four nozzles while image data of each 1,000 lines are dealt with as image data of one component.

The times for positioning and the three-dimensional configuration check are considerably greatly taken up in the processing time. However, according to the present invention, when three-dimensional images of the plurality of components sucked up by the plurality of nozzles are sequentially acquired by the 3D sensor and then the components are mounted on a board by the nozzles in order, the time of the period relating to the movement of the component from the component sucking-up position to the component mounting position is made approximately constant in both of a case where one component is sucked up and moved by one nozzle and a case where the plurality of components are sucked up and moved by the plurality of nozzles, resulting in obtaining great effects, specifically, in reduction of the processing time.

Figure 18:
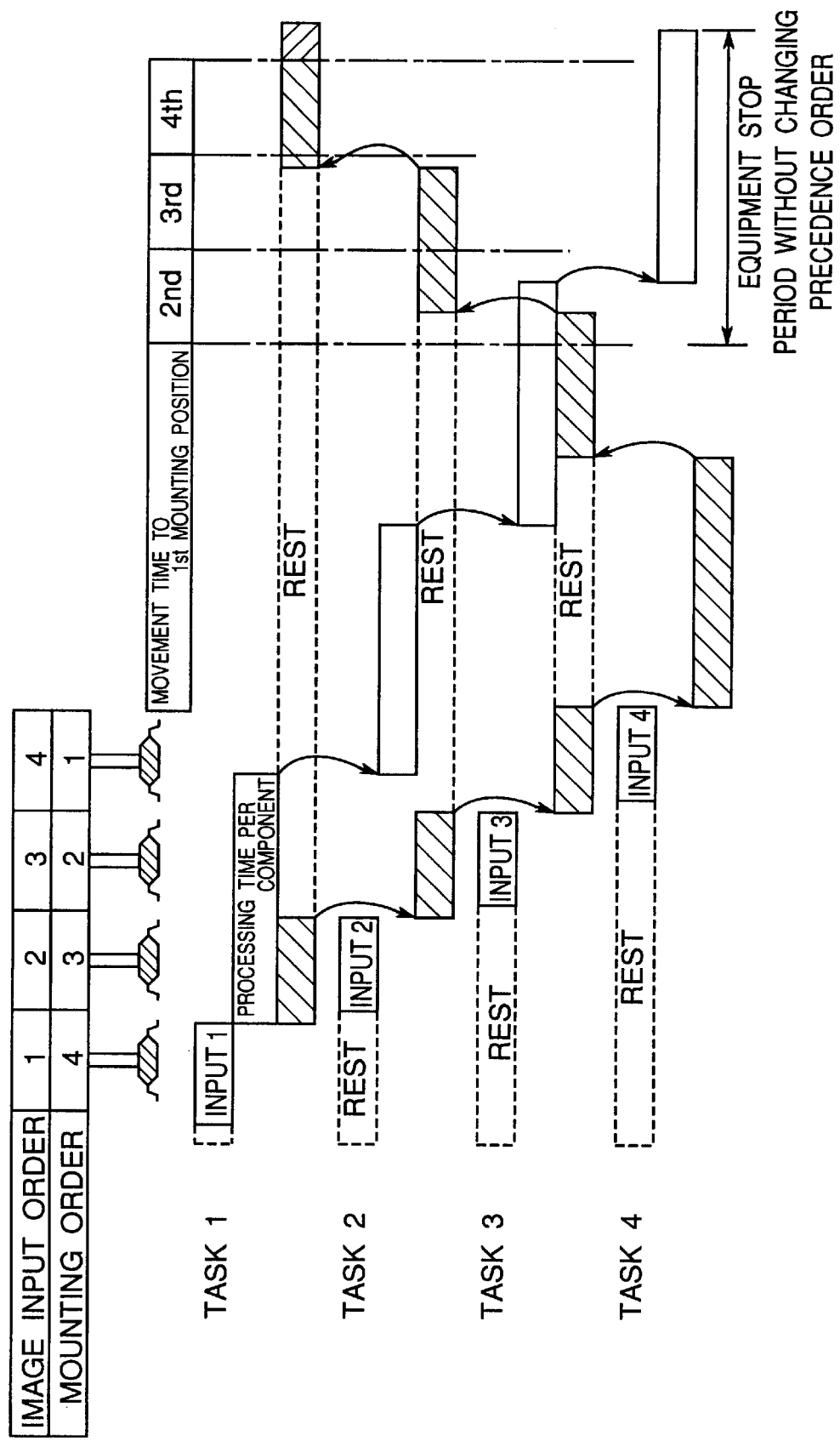
FIG. 18 is a timing chart showing the embodiment where images of a plurality of electronics components are acquired and processed.

As shown in FIG. 18, the sequential order of image processing can be suitably changed in the head section 7 having the plural nozzles, in consideration with the mounting order of the components 2. That is, for example, it is supposed that four nozzles (No. 1 through No. 4) suck up the components 2 in this order and their image data are acquired in the image memory circuit 35, and the components are mounted on a board by the four nozzles in the order of No. 1 through No. 4. At that time, each time the image data of each component are acquired, it is decided whether or not the image processing of the acquired image data should be performed in preference to the image processing of the image data of other components. Then, the image processing of the component having the highest priority can be performed in preference to other image processing. In such a case, since the image processing is performed in the earliest order of the mounting operation, the mounting operation can be performed after the corresponding image processing is being completed, even though the image processing of other components is performed.

Further, as apparent from the above description, enhancing the resolution would require not only the enhancement of the clock rate but also the decrease in the speed of the x-axis robot 5 at the same time.

In either case, to keep up with the narrowed pitch of components such as QFPs and connectors, it is indispensable to enhance the resolution of images, while components that can be measured with somewhat rough resolutions would be formed into images with the fastest possible scanning. In such cases, this means for enhancing the resolution is extremely effective.

As shown above, according to the present invention, a height image is acquiring by using a three-dimensional image-acquiring device, and image processing for the three-dimensional image acquired by this three-dimensional image-acquiring device is done. As a result, it becomes possible to perform the positioning of electronic components to be mounted and the three-dimensional component configuration examination typified by coplanarity check at the same time in one process.

Therefore, the mounting processing time can be reduced during the process of mounting components that require three-dimensional configuration check such as coplanarity check.

Also, the operating speed of head section-moving device for moving the head section such as x-axis or y-axis robot as an example can be made constant, and the movement of the component can be freed from stoppage among the mounting operations before and after the moving operation. Besides, asynchronous two axes (a driving shaft of the head section-moving device and a polygon mirror driving shaft) may be basically operated mechanically. Thus, there can be provided a system in which the horizontal and vertical pixel sizes (resolution) can be ensured by acquiring three-dimensional images with the three-dimensional image-acquiring device.

This also makes it possible to ensure the horizontal and vertical pixel sizes (resolution) with respect to the acquired image during the component mounting.

Further, for the mounting of narrow-pitch components such as QFPs and connectors, an image enhanced in resolution in the acquired image of the component is acquired. On the other hand, for the mounting of components that can be measured with somewhat rough resolution, image-acquiring can be accomplished by fast scanning with lowered resolution (as compared with the case of enhanced resolution) while maintaining the normality of pixels in the acquired image of the mounting component.

Thus, for the mounting of narrow-pitch components such as QFPs and connectors, the electronic component mounting apparatus can be flexibly adapted to higher speed and higher resolution (higher precision) of the mounting.

Although the outputs of the encoder 24 are used for detecting a relative position from the reference position on the x-axis robot 5 of the head section 7 in the embodiments, it is possible to detect the position of the head section 7 by directly applying a linear scale to the x-axis robot 5.

The entire disclosure of Japanese Patent Application No. 8-100744 filed on Apr. 23, 1996, including specification, claims, drawings, and summary are incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An electronic component mounting apparatus comprising:

a component feeding section (4) for feeding an electronic component (2) to be mounted onto a board;

a head section (7) for holding the electronic component (2) fed from the component feeding section (4);

a head section-moving device (5,6) for moving the head section (7) holding the electronic component (2);

a three-dimensional image-acquiring device (8), provided at a position below a moving range of the head section (7), for performing, with a laser beam, line scanning the component (2) held by the head section (7) to obtain, from each scanning line, positional data of a position where the component is present and height data of the component (2) corresponding to the positional data;

an image memory (35) for storing the height data obtained from the three-dimensional image-acquiring device (8) as three-dimensional image data; and a control section (21) for performing image processing for the three-dimensional image data of the electronic component (2), and mounting the component onto the board based on the obtained height data and the obtained positional data of the position, and result of the image processing for the three-dimensional image data.

2. An electronic component mounting apparatus according to claim 1, wherein the control section is so arranged that the three-dimensional image data of the electronic component obtained by laser-beam scanning in a direction vertical to a direction in which the electronic component is moved above the three-dimensional image-acquiring device is acquired into the image memory, while an operating speed of the moving device for moving the electronic component is made constant.

3. An electronic component mounting apparatus comprising:

a moving device (5,6) for moving an electronic component (2) to be mounted onto a board;

a polygon mirror (8) disposed at a position below the moving device;

a semiconductor laser (10) which emits a laser beam for the polygon mirror;

a position sensing device (17a,17b) disposed at a position around the polygon mirror; and an image-forming lens (16a,16b) for forming as an image on the position sensing device the laser beam that has struck a bottom surface of the electronic component, wherein the semiconductor laser is so placed that its laser beam will strike the rotating polygon mirror, being thereby reflected, and strike the bottom surface of the electronic component that passes above the polygon mirror, and wherein a three-dimensional image of the electronic component obtained by computing data outputted by the position sensing device is acquired into an image memory based on a passing operation of the electronic component above the polygon mirror by the moving device and laser scanning triggered by a rotating operation of the polygon mirror, whereby a positioning of the electronic component and a configuration check thereof are performed with the three-dimensional image, and the component is mounted onto the board based on result of the positioning of the electronic component and the configuration check thereof.

4. An electronic component mounting apparatus according to claim 3, further comprising:

a moving-amount detecting circuit (26) for calculating a moving amount of the moving device from a reference position of the moving device;

a rotation-amount detecting circuit (28) for calculating a rotation amount of the polygon mirror from a reference position of the polygon mirror upon reception of a rotation-amount signal of the polygon mirror; and a first comparing circuit (30) for comparing the moving amount of the moving device and the rotation amount of the polygon mirror with each other, wherein when a difference between the moving amount of the moving device and the rotation amount of the polygon mirror as a comparison result obtained from the first comparing circuit falls within an allowable range, the data stored in the image memory is processed as effective data, while when the difference does not fall within the allowable range, the data stored in the image memory is processed as ineffective data.

5. An electronic component mounting apparatus according to claim 3, further comprising:

a moving-speed detecting circuit (27) for calculating a moving speed of the moving device at each time;

a rotation-speed detecting circuit (29) for calculating a rotation speed of the polygon mirror at each time upon reception of a rotation-amount signal of the polygon mirror;

a second comparing circuit (31) for comparing the moving speed of the moving device and the rotation speed of the polygon mirror with each other, wherein when a difference between the moving speed of the moving device and the rotation speed of the polygon mirror as a comparison result obtained from the second comparing circuit falls within an allowable range, the data stored in the image memory is processed as effective data, while when the difference does not fall within the allowable range, the data stored in the image memory is processed as ineffective data.

6. An electronic component mounting apparatus according to claim 3, further comprising:

a clock rate changing means for changing a fundamental clock rate at which the three-dimensional image is acquired, wherein when a high resolution is needed for the three-dimensional image, the fundamental clock rate is made faster by the clock rate changing means while the moving speed of the moving device is made slower, and wherein when a high-speed is needed for acquiring the three-dimensional image, the fundamental clock is made slower by the clock rate changing means while the moving speed of the moving device is made faster.

7. An electronic component mounting apparatus according to claim 3, further comprising:

a device (300) for calculating a distance by which the component is moved during a time after the component is located at an image data-acquiring start position until the component is located at a valid laser beam start position of line scanning, wherein taking in consideration of the distance calculated by the calculating means, positioning of the component is performed by using the three-dimensional image.

8. An electronic component mounting apparatus according to claim 4, further comprising:

a moving-speed detecting circuit (27) for calculating a moving speed of the moving device at each time;

a rotation-speed detecting circuit (29) for calculating a rotation speed of the polygon mirror at each time upon reception of a rotation-amount signal of the polygon mirror;

a second comparing circuit (31) for comparing the moving speed of the moving device and the rotation speed of the polygon mirror with each other, wherein when a difference between the moving speed of the moving device and the rotation speed of the polygon mirror as a comparison result obtained from the second comparing circuit falls within an allowable range, the data stored in the image memory is processed as effective data, while when the difference does not fall within the allowable range, the data stored in the image memory is processed as ineffective data.

9. An electronic component mounting apparatus according to claim 7, further comprising:

a clock rate changing means for changing a fundamental clock rate at which the three-dimensional image is acquired, wherein when a high resolution is needed for the three-dimensional image, the fundamental clock rate is made faster by the clock rate changing means while the moving speed of the moving device is made slower, and wherein when a high-speed is needed for acquiring the three-dimensional image, the fundamental clock is made slower by the clock rate changing means while the moving speed of the moving device is made faster.

10. An electronic component mounting apparatus according to claim 5, further comprising:

a clock rate changing means for changing a fundamental clock rate at which the three-dimensional image is acquired, wherein when a high resolution is needed for the three-dimensional image, the fundamental clock rate is made faster by the clock rate changing means while the moving speed of the moving device is made slower, and wherein when a high-speed is needed for acquiring the three-dimensional image, the fundamental clock is made slower by the clock rate changing means while the moving speed of the moving device is made faster.

11. An electronic component mounting apparatus according to claim 4, further comprising:

a device (300) for calculating a distance by which the component is moved during a time after the component is located at an image data-acquiring start position until the component is located at a valid laser beam start position of line scanning, wherein taking in consideration of the distance calculated by the calculating means, positioning of the component is performed by using the three-dimensional image.

12. An electronic component mounting apparatus according to claim 5, further comprising:

a device (300) for calculating a distance by which the component is moved during a time after the component is located at an image data-acquiring start position until the component is located at a valid laser beam start position of line scanning, wherein taking in consideration of the distance calculated by the calculating means, positioning of the component is performed by using the three-dimensional image.

13. An electronic component mounting apparatus according to claim 6, further comprising:

a device (300) for calculating a distance by which the component is moved during a time after the component is located at an image data-acquiring start position until the component is located at a valid laser beam start position of line scanning, wherein taking in consideration of the distance calculated by the calculating means, positioning of the component is performed by using the three-dimensional image.

* * * * *